United States Patent
Nonaka

(10) Patent No.: US 7,703,056 B2
(45) Date of Patent: Apr. 20, 2010

(54) CIRCUIT DESIGNING PROGRAM AND CIRCUIT DESIGNING SYSTEM HAVING FUNCTION OF TEST POINT INSERTION

(75) Inventor: Junpei Nonaka, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 144 days.

(21) Appl. No.: 11/907,714

(22) Filed: Oct. 16, 2007

(65) Prior Publication Data

US 2008/0091987 A1    Apr. 17, 2008

(30) Foreign Application Priority Data

Oct. 17, 2006    (JP)    ............... 2006-282330

(51) Int. Cl.
*G06F 17/50*    (2006.01)
(52) U.S. Cl. ................... 716/4; 716/5; 716/6; 714/724; 702/185
(58) Field of Classification Search ................. 716/4–6; 714/724; 702/185
See application file for complete search history.

(56) References Cited

U.S. PATENT DOCUMENTS

| | | | | |
|---|---|---|---|---|
| 5,663,967 | A * | 9/1997 | Lindberg et al. | ............ 714/737 |
| 6,463,560 | B1 * | 10/2002 | Bhawmik et al. | ........... 714/733 |
| 7,185,254 | B2 * | 2/2007 | Ishida et al. | ................ 714/738 |
| 7,188,323 | B2 * | 3/2007 | Wang et al. | .................... 716/4 |
| 7,296,249 | B2 * | 11/2007 | Rinderknecht et al. | ......... 716/4 |
| 7,437,641 | B1 * | 10/2008 | Gorshe | ....................... 714/732 |
| 2003/0200492 | A1 * | 10/2003 | Nakao et al. | ................ 714/724 |
| 2005/0235183 | A1 * | 10/2005 | Wang et al. | ................ 714/726 |
| 2007/0100586 | A1 * | 5/2007 | Cheng et al. | ................ 702/185 |
| 2007/0234161 | A1 * | 10/2007 | Blanton et al. | .............. 714/736 |

FOREIGN PATENT DOCUMENTS

JP    2005-135226    5/2005

* cited by examiner

*Primary Examiner*—Naum B Levin
(74) *Attorney, Agent, or Firm*—McGinn IP Law Group PLLC

(57) ABSTRACT

A circuit design program product to cause a computer to execute a circuit design process based on a test point insertion, includes: a step for making reference to a netlist to extract a plurality of equivalent faults $f_j$; a step for searching a number $n(f_j)$ of test point required for a number of the equivalent fault keeping equivalent relation with a search object equivalent fault $f_j$ with each of a plurality of equivalent faults as the search object equivalent fault to become a predetermined number and a insertion position $G(f_j)$; a step for calculating probability $p(f_j)$ of a single stuck-at fault being included in a set of equivalent faults including at least a search object equivalent fault $f_j$ at an occasion when the relevant stuck-at fault takes place in the circuit; a step for calculating a parameter $e(f_j)$ derived by an equation: $e(f_j)=p(f_j)/n(f_j)$ on each pattern of an insertion position $G(f_j)$; and a step for determining the insertion position $G(f_{max})$ giving the maximum value among the calculated parameters $e(f_j)$ as a position where the test point is inserted.

15 Claims, 21 Drawing Sheets

Figure 5

| FAULT LIST | | |
|---|---|---|
| FAULT ($f_j$) | NODE | STACK AT 0 or 1 |
| $f_1$ | NA(3) | 0 |
| $f_2$ | NA(3) | 1 |
| $f_3$ | NB(3) | 0 |
| $f_4$ | NB(3) | 1 |
| $f_5$ | NC(7) | 0 |
| $f_6$ | NC(7) | 1 |
| $f_7$ | ND(2) | 0 |
| $f_8$ | ND(2) | 1 |
| $f_9$ | NE(3) | 0 |
| $f_{10}$ | NE(3) | 1 |
| $f_{11}$ | NF(2) | 0 |
| $f_{12}$ | NF(2) | 1 |

Figure 6

| FIRST EQUIVALENT FAULT CLASS | $f_j = f_1, f_3, f_6, f_7, f_{10}, f_{11}$ |
|---|---|
| SECOND EQUIVALENT FAULT CLASS | $f_j = f_8, f_9$ |

Figure 7

| FAULT($f_j$) | TEST POINT REQUIRED FOR ESTABLISHING INDEPENDENT FAULT ||
|---|---|---|
| | INSERTION POSITION G($f_j$) | NUMBER n($f_j$) |
| $f_1$ | P1 | 1 |
| $f_3$ | P2 | 1 |
| $f_6$ | P3,P5 | 2 |
| $f_7$ | P4 | 1 |
| $f_8$ | P4 | 1 |
| $f_9$ | P4 | 1 |
| $f_{10}$ | P4,P6 | 2 |
| $f_{11}$ | P7 | 1 |

Figure 8

| INSERTION POSITION PATTERN (k) | INSERTION POSITION G(k) | NUMBER n(k) | EQUIVALENT FAULT Fs(k) TO BECOME INDEPENDENT FAULT BY TEST POINT INSERTION |
|---|---|---|---|
| 1 | P1 | 1 | $f_1$ |
| 2 | P2 | 1 | $f_3$ |
| 3 | P3,P5 | 2 | $f_6$ |
| 4 | P4 | 1 | $f_7, f_8, f_9,$ |
| 5 | P4,P6 | 2 | $f_7, f_8, f_9, f_{10}$ |
| 6 | P7 | 1 | $f_{11}$ |

Figure 9

| INSERTION POSITION PATTERN (k) | FAULT Fs(k) | TOTAL WIRING LENGTH ls(k) OF FAULT Fs(k) | OCCURRENCE PROBABILITY p(k) OF FAULT Fs(k) |
|---|---|---|---|
| 1 | $f_1$ | 3 | 7.50% |
| 2 | $f_3$ | 3 | 7.50% |
| 3 | $f_6$ | 7 | 17.50% |
| 4 | $f_7, f_8, f_9,$ | 7 | 17.50% |
| 5 | $f_7, f_8, f_9, f_{10}$ | 10 | 25.00% |
| 6 | $f_{11}$ | 2 | 5.00% |

Figure 10

| INSERTION POSITION PATTERN (k) | INSERTION POSITION G(k) | NUMBER n(k) | OCCURRENCE PROBABILITY p(k) OF FAULT Fs(k) | ANALYZABILITY IMPROVEMENT RATE PER TEST POINT e(k)= p(k)/n(k) |
|---|---|---|---|---|
| 1 | P1 | 1 | 7.50% | 7.50% |
| 2 | P2 | 1 | 7.50% | 7.50% |
| 3 | P3,P5 | 2 | 17.50% | 8.75% |
| 4 | P4 | 1 | 17.50% | 17.50% |
| 5 | P4,P6 | 2 | 25.00% | 12.50% |
| 6 | P7 | 1 | 5.00% | 5.00% |

Figure 16

| FAULT($f_j$) | TEST POINT REQUIRED FOR PAIRING INDEPENDENT FAULT | | INDEPENDENT FAULT PAIR |
|---|---|---|---|
| | INSERTION POSITION $G(f_j)$ | NUMBER $n(f_j)$ | |
| $f_1$ | P3 | 1 | $\{f_1, f_3\}$ |
| $f_1$ | P2, P5 | 2 | $\{f_1, f_6\}$ |
| $f_1$ | P2, P6, P7 | 3 | $\{f_1, f_6\}$ |
| ⋮ | ⋮ | ⋮ | ⋮ |
| $f_7$ | P6 | 1 | $\{f_7, f_{10}\}$ |
| $f_7$ | P5, P7 | 2 | $\{f_7, f_{10}\}$ |
| ⋮ | ⋮ | ⋮ | ⋮ |
| $f_{11}$ | P4, P5 | 2 | $\{f_{11}, f_{10}\}$ |
| $f_{11}$ | P3, P6 | 2 | $\{f_{11}, f_6\}$ |
| ⋮ | ⋮ | ⋮ | ⋮ |

Figure 18

| k | INSERTION POSITION G(fj) | NUMBER n(k) | INDEPENDENT FAULT PAIR Fs(k) | TOTAL WIRING LENGTH ls(k) | OCCURRENCE PROBABILITY p(k) OF FAULT Fs(k) | ANALYZABILITY IMPROVEMENT RATE e(k) |
|---|---|---|---|---|---|---|
| 1 | P3, P5 | 2 | $\{f_{11}, f_6\}, \{f_{10}, f_7\}, \{f_3, f_1\}$ | 20 | 50.00% | 25.50% |
| 2 | P4, P5 | 2 | $\{f_{11}, f_{10}\}$ | 5 | 12.50% | 6.25% |
| 3 | P7, P1, P6 | 3 | $\{f_{10}, f_7\}, \{f_6, f_3\}$ | 15 | 37.50% | 12.50% |
| 4 | P7, P2, P6 | 3 | $\{f_{10}, f_7\}, \{f_6, f_1\}$ | 15 | 37.50% | 12.50% |
| 5 | P7, P3, P4 | 3 | $\{f_{10}, f_6\}, \{f_3, f_1\}$ | 16 | 40.00% | 13.33% |
| 6 | P7, P5 | 2 | $\{f_{10}, f_7\}$ | 5 | 12.50% | 6.25% |
| 7 | P6 | 1 | $\{f_{10}, f_7\}$ | 5 | 12.50% | 12.50% |
| 8 | P5, P1 | 2 | $\{f_6, f_3\}$ | 10 | 25.50% | 12.50% |
| 9 | P5, P2, | 2 | $\{f_6, f_1\}$ | 10 | 25.00% | 12.50% |
| 10 | P3 | 1 | $\{f_1, f_3\}$ | 6 | 15.00% | 15.00% |

Figure 21

| FAULT($f_j$) | TEST POINT REQUIRED FOR ESTABLISHING INDEPENDENT FAULT | | WIRING LENGTH $l(f_j)$ | FAULT OCCURRENCE PROBABILITY $p(f_j)$ | ANALYZABILITY IMPROVEMENT RATE $e(k)$ |
|---|---|---|---|---|---|
| | INSERTION POSITION $G(f_j)$ | NUMBER $n(f_j)$ | | | |
| $f_1$ | P1 | 1 | 3 | 7.50% | 7.50% |
| $f_3$ | P2 | 1 | 3 | 7.50% | 7.50% |
| $f_6$ | P3, P5 | 2 | 7 | 17.50% | 8.75% |
| $f_7$ | P4 | 1 | 2 | 5.00% | 5.00% |
| $f_8$ | P4 | 1 | 2 | 5.00% | 5.00% |
| $f_9$ | P4 | 1 | 3 | 7.50% | 7.50% |
| $f_{10}$ | P4, P6 | 2 | 3 | 7.50% | 3.75% |
| $f_{11}$ | P7 | 1 | 2 | 5.00% | 5.00% |

CIRCUIT DESIGNING PROGRAM AND CIRCUIT DESIGNING SYSTEM HAVING FUNCTION OF TEST POINT INSERTION

BACKGROUND OF THE INVENTION

1. Field of the Invention

The present invention relates to design technology on semiconductor integrated circuits. In particular, the present invention relates to a circuit designing system carrying out circuit designing processing based on a Test Point Insertion method and a circuit designing program.

2. Description of Related Art

In the field of semiconductor integrated circuits, there is a possibility of including defective products in the produced products at some percentages.

Accordingly, during the testing step, the defective products are removed and only good products are shipped. A yield rate at the occasion is called a yield factor. In order to improve the yield factor, it is necessary to clarify to improve the manufacturing process.

However, in the recent years, as the microtechnology is applied to semiconductor integrated circuits more, failure analysis is becoming more difficult. A reason thereof is that a failure analyzer is lacking resolution for the element size in the integrated circuit. For example, conventionally, as failure analyzer, optical failure analyzers such as an emission microscope, OBIRCH (Optical Beam Induced Resistance Change) apparatus and LVP (Laser Voltage Probe) have been used.

Such an optical failure analyzer uses long-wavelength light in the infra-red region and cannot obtain resolution not more than several tenths of a micron due to influence of the diffractive limit.

As an apparatus showing resolution higher than the above described optical failure analyzer, an electron beam (EB: Electron Beam) analyzer is known. In the case of an EB analyzer, electron beams are required to irradiate directly the wiring for analysis. However, in the current circumstances with increasing the number of wiring layers up to around eight layers, the wiring for analysis is not exposed in a lot of cases. Therefore, the EB analyzer is hardly applicable as well.

In addition, fault diagnosis guessing fault sites based on the result of an LSI test such as scan test is being widely used. However, in the case where the fault sites include a lot of equivalent faults, fault diagnosis cannot specify the true fault sites but a plurality of fault candidates will be extracted. In that case, it is still necessary to specify the true fault sites from a plurality of the fault candidates through measuring. For that purpose, it is necessary to use a Focused Ion Beam (FIB) apparatus to expose the wiring for measuring. And, after the wiring exposing processing is carried out, the EB analyzer is used to carry out measuring. However, a number of fault candidates occasionally increases to an extreme extent and, then, a significant number of steps will be required, resulting in an increase in work period required for fault analysis.

As one of Design For Testability (DFT) for simplifying such fault analysis, "Test Point Insertion" is known. According to TPI, in order to enhance testability (controlling performance and observing performance), a register called test point is inserted into a circuit for designing (see Patent Document 1 and Patent Document, for example).

The Patent Document 2 (Japanese Patent Application Laying Open 2005-313953) thereof describes the fault analysis simplifying technology formerly invented by the inventor of the present application. This document 2 is published as a United States patent application publication No. 2007/0113127. According to the fault analyzability technology (hereinafter to be referred to as "conventional system") related to the preceding application, determination on the insertion position of the observation point (test point) will be devised to enable improvement in fault analyzability efficiently with further less observation points.

FIG. 1 exemplifies a circuit designing system related to an embodiment of a conventional system. That circuit design system comprises an input unit 1101, a storage 1103, a circuit layout unit 1105, a cell-to-cell distance extraction unit 1107, a fault candidate extraction unit 1109, a determination unit 1111, an observation point insertion unit 1113, a circuit wiring unit 1115 and an output unit 1117. The determination unit 1111 includes a fault analyzability assessment unit 1119 and an insertion positioning unit 1121. That circuit design system will be operated as follows.

At first, a NETLIST NET is input by the input unit 1101 and stored in the storage unit 1103. The circuit layout unit 1105 refers to that the NETLIST NET to arrange a cell group. Cell placement data ARR indicating the cell arrangement are stored in the storage unit 1103 and are output to the cell-to-cell distance extraction unit 1107. The cell-to-cell distance extraction unit 1107 makes reference to the placement data ARR to extract and calculate on cell-to-cell distance information. The cell-to-cell distance information DIS indicating the obtained cell-to-cell distance is output to the determination unit 1111.

The fault candidate extraction unit 1109 makes reference to the NETLIST NET to extract an equivalent fault class. The equivalent fault class consists of a plurality of fault candidates kept in equivalent relations, and measurement from outside cannot specify the fault sites in the equivalent fault class. For example, an equivalent fault class G1, G2 . . . GI (the suffix I being 1 or a larger integer) is assumed to be extracted. The respective equivalent fault class Gi ($1 \leq i \leq I$) includes a plurality of equivalent fault nodes Ni1, Ni2 . . . NiJi (hereinafter to be referred to simply as node). The suffix Ji is the node number (fault candidate number) included in the equivalent fault class Gi. The fault candidate extraction unit 1109 outputs fault candidate data CAN indicting the extracted equivalent fault class Gi to the determination unit 1111.

Based on the fault candidate data CAN and the cell-to-cell distance data DIS, the determination unit 1111 determines "object node" where the observation points should be inserted from a plurality of nodes. Specifically, at first, the fault analyzability assessment unit 1119 of the determination unit 1111 calculates a parameter M derived by the following equation (1).

[Formula 1]

$$M = \sum_{i=1}^{I} J_i \cdot P_i \qquad (1)$$

In the above described equation (1), the parameter Pi represents probability of a single stuck-at fault being included in the equivalent fault class Gi at an occasion when the relevant stuck-at fault takes place. In the circuit region with large cell-to-cell distance, wiring bringing the cells into connection will get long. Therefore probability of fault occurrence will become large. Accordingly, the probability Pi of the single stuck-at fault being included in the equivalent fault class Gi is given by the following equation (2), for example.

[Formula 2]

$$P_i = \frac{1}{2} \cdot \frac{\sum_{j=1}^{J_i} L_{ij}}{L_{all}} \quad (2)$$

In the above described equation (2), the length $L_{all}$ is a total length of all the equivalent fault classes G1 to GI or the entire wiring included in the entire circuit.

The length Lij is the respective wiring length of a plurality of nodes Ni1, Ni2 . . . NiJi included in a certain equivalent fault class Gi (the suffix j being an integer of not less than 1 and not more than Ji). Here, the fault analyzability assessment unit 1119 makes reference to cell-to-cell distance indicated by the cell-to-cell distance data DIS and thereby can guess the respective wiring length Lij.

As indicated in the above described equation (1), the parameter M is derived by the sum of parameter Ji·Pi for all the equivalent fault classes G1 to GI. That parameter M means an "average value" of the equivalent fault node number (fault candidate number) in the case where the single stuck-at fault has taken place in an arbitrary place in the circuit. In order to simplify fault analysis, only the average value of the fault candidate number at an occurrence of fault, that is, the parameter M has to be reduced. In that mean, the parameter M is referred to as "fault analyzability". In order to improve fault analyzability M, that is, in order to reduce the parameter M, only the observation point has to be inserted into an appropriate position.

The insertion positioning unit 11221 of the determination unit 1111 determines such an observation point insertion position (object node) that improves the fault analyzability M "effectively". For example, the insertion positioning unit 1121 determines an object node so as to reduce the parameter M to the maximum extent. For example, one equivalent fault class Gi including the maximum node number Ji has a large parameter Ji·Pi and contributes to the parameter M significantly. Accordingly, the object node is selected from equivalent fault nodes Ni1, Ni2 . . . NiJi included in that one equivalent fault class Gi and thereby the parameter M can be reduced significantly. Prioritized insertion of the observation point into the equivalent fault class including a lot of equivalent fault node will enable efficient improvement in the fault analyzability M.

Thus, the determination unit 1111 determines the object node where an observation point is to be inserted to generate observation point insertion position data PNT indicating the determined object node. The observation point insertion unit 1113 makes reference to the NETLIST NET and the observation point insertion position data PNT to insert at least one observation point into the object node. Thereby, the NETLIST NET is updated.

Corresponding with necessity, the above described process is repeated. The required process of observation point insertion process is finished and, then, the circuit wiring unit 1115 reads the NETLIST NET and the placement data ARR from the storage unit 1103. And, the circuit wiring unit 1115 carries out wiring process (routing) based on the NETLIST NET and the layout data ARR. Thereby, the layout data LAY indicating the layout of the circuit for design is prepared. The layout data LAY is output by the output unit 1117.

As described above, according to the conventional system, the object node is determined based on the node number Ji. For example, the probability of fault taking place in the equivalent fault class Gi including the maximum node number Ji may be the highest among all the equivalent fault classes. Accordingly, the object node is selected from one equivalent fault class Gi including the maximum node number Ji so that the observation point is inserted into that object node in a prioritized manner. Thereby, the average value (parameter M) of the fault candidate number in the case where the single stuck-at fault has taken place in an arbitrary place in the circuit is reduced efficiently. That is, improvement in the fault analyzability M is enabled at less insertion number of the observation point.

[Patent Document 1] Japanese Patent Application Laying Open 2005-135226

[Patent Document 2] Japanese Patent Application Laying Open 2005-313953

According to the conventional system, the "average value" of the fault candidate number at an occasion when the fault has taken place is reduced and thereby fault analysis is simplified. However, that does not necessarily means that the fault sites are not focused into one node through fault diagnosis. A reason thereof is that the observation points (test points) are preferentially inserted into the equivalent fault class with the large fault candidate number. Although the "average value" of the fault candidate number at a fault occurrence is reduced, the number of the fault candidate does not necessarily become one.

"Improvement in fault analyzability" can be contemplated from various points of views. From a certain point of view, the improvement in fault analyzability will mean to reduce the average value of the fault candidate number at a fault occurrence as in the conventional system. In addition, as another point of view, it is also contemplated to simplify fault site focusing so as to contribute to improvement in fault analyzability. At an occasion when a fault has taken place, such a technology is desired to increase the probability of enabling narrowing the fault candidate number down at least to a designated number.

SUMMARY OF THE INVENTION

In a first point of view of the present invention, a circuit design program to cause a computer to execute a circuit design process with a test point insertion method is provided. The circuit design process includes: (A) a step for making reference to a netlist of a circuit to extract a plurality of equivalent faults $f_j$ keeping mutually equivalent relation from all stuck-at faults possibly taking place in the circuit; (B) a step for searching a number $n(f_j)$ of test points required for the number of equivalent fault keeping equivalent relation with a search object equivalent fault $f_j$ with each of a plurality of equivalent faults as the search object equivalent fault to become a predetermined number and a insertion position $G(f_j)$; (C) a step for calculating probability $p(f_j)$ included of a single stuck-at fault being included in a set of equivalent faults including at least search object equivalent fault $f_j$ at an occasion when the stuck-at fault takes place in the circuit; (D) a step for calculating a parameter $e(f_j)$ derived by an equation: $e(f_j)=p(f_j)/n(f_j)$ on each pattern of the insertion position $G(f_j)$; (E) a step for determining the insertion position $G(f_{max})$ giving the maximum value among the calculated parameters $e(f_j)$ as a position where the test point is inserted; and (F) a step for respectively inserting the $n(f_{max})$ test points into the determined insertion position $G(f_{max})$.

For example, the above described predetermined number is 1. In that case, in the above described (B) steps a number $n(f_j)$ of test points required for the search object equivalent fault $f_j$ to become an "independent fault" and the insertion position $G(f_j)$ are searched. Here, the independent fault refers to a fault in presence of an equivalent fault keeping equivalent relation only with itself and a fault deprived of the equivalent relation with the other faults. That is, the position of the independent fault can be specified by fault diagnosis. At an occurrence of a single stuck-at fault, if that single stuck-at fault is an independent fault, fault diagnosis can narrow the fault sites thereof down to one node. Accordingly, it is preferable to make a node with high probability of occurrence of the single stuck-at fault preferentially appointed as the independent fault node.

Next, due to test point insertion to the insertion position $G(f_j)$, a set $Fs(f_j)$ of the search object equivalent fault $f_j$ and concurrently an equivalent fault $f_j$ to become an independent fault are obtained. The set $Fs(f_j)$ can be configured by a plurality of equivalent faults $f_j$ including the search object equivalent fault $f_j$. At an occurrence when a single stuck-at fault takes place, if the relevant single stuck-at fault is included in a set of independent faults $Fs(f_j)$, the fault sites can be narrowed down to one node by fault diagnosis. Accordingly, in the above described (C) step, probability $p(f_j)$ of the single stuck-at fault being included in the set $Fs(f_j)$ is calculated. If the test points are inserted into the insertion position $G(f_j)$, even if stuck-at fault has taken place in the set $Fs(f_j)$ at the probability $p(f_j)$, the fault sites can be specified. In other words, by inserting the test points into the insertion position $G(f_j)$, fault analyzability is improved only for a portion corresponding with the probability $p(f_j)$. In that means, the probability $p(f_j)$ can be referred to as "analyzability improvement level".

In order to enhance the effects by test point insertion, it is preferable to insert a test point into an insertion position $G(f_j)$ giving a high analyzability improvement level $p(f_j)$. However, since various numbers $n(f_j)$ of required test point are present, it is convenient to standardize the fault analyzability improvement level $p(f_j)$ with the number $n(f_j)$ of test point. Therefore, in the above described (D) step, the parameter $e(f_j)$ is calculated according to the equation: $e(f_j)=p(f_j)/n(f_j)$. The parameter $e(f_j)$ is a standardized analyzability improvement level and can be called "analyzability improvement rate" for one test point.

According to the present invention, the insertion position $G(f_{max})$ giving the maximum analyzability improvement rate $e(fmax)$ is determined as final test point insertion position. And, $n(fmax)$ units of test points are respectively inserted into the insertion position $G(f_{max})$ thereof. Consequently, the probability of fault sites allowed to be narrowed down into one node by the faulty diagnosis at a fault occurrence will get higher than in the conventional system.

Here, the above described predetermined number is not limited to 1. The above described predetermined number can be an integer of not less than 2. In that case, the probability of the fault candidate number allowed to be narrowed down at least up to the designated number at an occurrence when a fault takes place will get higher than in the conventional system.

In a second point of view of the present invention, a circuit design system based on the test point insertion method is provided. That circuit design system comprises a storage unit, an equivalent fault extraction unit, a insertion position searching unit, a fault probability calculation unit, a determination unit and a test point insertion unit. The netlist of a circuit is stored in the storage unit. The equivalent fault extraction unit makes reference to the netlist to extract a plurality of equivalent faults $f_j$ keeping mutually equivalent relation from all stuck-at faults possibly taking place in a circuit. The insertion position searching unit searches a number $n(f_j)$ of test points required for a number of equivalent fault keeping equivalent relation with a search object equivalent fault $f_j$ with each of a plurality of equivalent faults $f_j$ as the search object equivalent fault to become a predetermined number and a insertion position $G(f_j)$. The fault probability calculation unit calculates probability $p(f_j)$ of a single stuck-at fault being included in a set of equivalent faults including at least search object equivalent fault $f_j$ at an occasion when the relevant stuck-at fault takes place in the circuit. The determination unit calculates a parameter $e(f_j)$ derived by an equation: $e(f_j)=p(f_j)/n(f_j)$ on each pattern of an insertion position $G(f_j)$ and searches the insertion position $G(f_{max})$ giving the maximum value among the calculated parameters $e(f_j)$. The test point insertion unit respectively inserts the $n(f_{max})$ test points into the insertion position $G(f_{max})$.

According to the present invention, the probability of the fault candidate number allowed to be narrowed down at least up to the designated number at an occurrence when a fault takes place will get higher. Consequently, the fault analyzability is improved.

BRIEF DESCRIPTION OF THE DRAWINGS

The above and other aspects, advantages and features of the present invention will be more apparent from the following description of certain preferred embodiments taken in conjunction with the accompanying drawings, in which:

FIG. 5 is a table presenting a list of stuck-at fault $f_i$.

FIG. 6 is a table presenting a list of equivalent fault class $f_j$.

FIG. 7 is a table presenting a number of $n(f_j)$ of test point required for establishing independent fault and insertion position $G(f_j)$.

FIG. 8 is a table presenting a set $Fs(k)$ of equivalent fault to become an independent fault by test point insertion on each of the patterns $G(k)$ of insertion position.

FIG. 9 is a table presenting the fault occurrence probability $p(k)$ in the set $Fs(k)$ on each of the patterns $G(k)$ of insertion position.

FIG. 10 is a table presenting the analyzability improvement rate $e(k)$ on each of the patterns $G(k)$ of insertion position.

FIG. 16 is a table presenting a number of n(f$_j$) of test point required for establishing independent fault pair and insertion position G(f$_j$).

FIG. 18 is a table presenting the set Fs(k), the fault occurrence probability p(k) and analyzability improvement rate e(k) on each of the patterns G(k) of insertion position.

FIG. 21 is a table presenting the insertion position G(f$_j$), the number n(f$_j$), the fault occurrence probability p(f$_j$) and analyzability improvement rate e(f$_j$) on each of the equivalent fault (f$_j$).

DETAILED DESCRIPTION OF THE PREFERRED EMBODIMENT

With reference to the accompanying drawings, a circuit design technology (fault analyzability technology) related to the present invention will be described.

In the present invention, the circuit design is carried out based on the TPI technique.

First Embodiment 1-1 Summary of Configuration and Process

Figure 1:
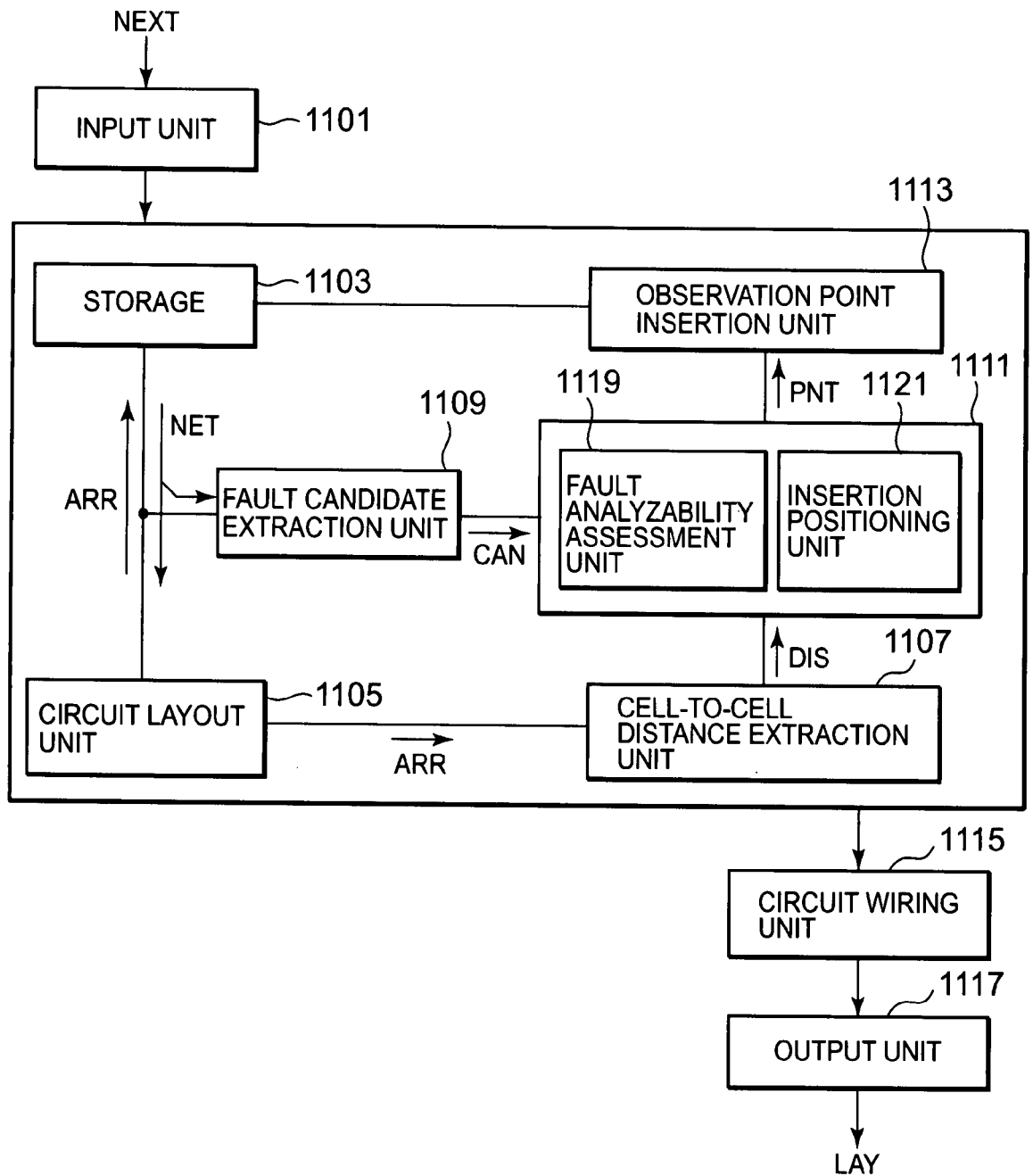
FIG. 1 is a block diagram illustrating an invention described in the preceding application (Japanese Patent Application Laying Open 2005-313953) by the inventor hereof.
Figure 2:
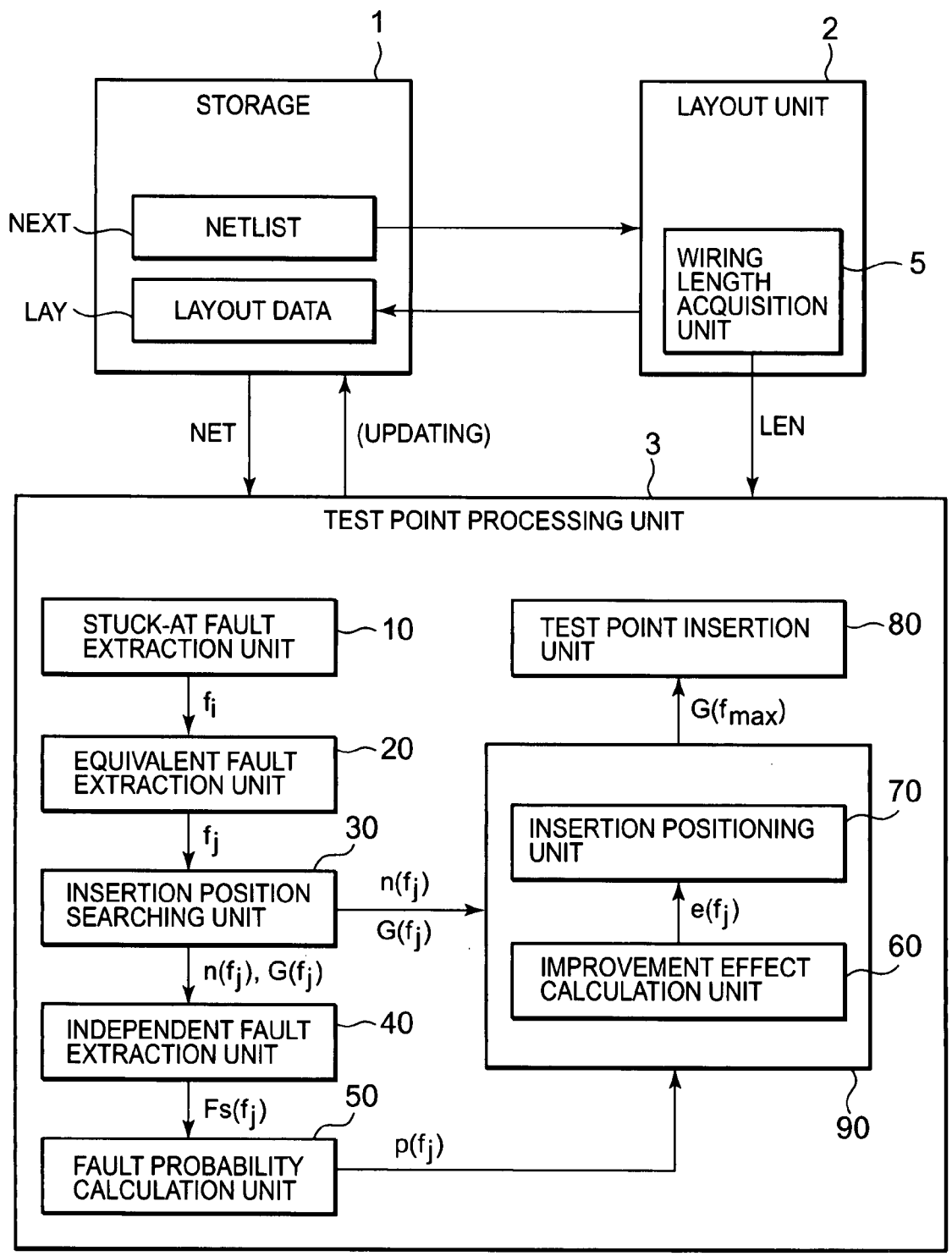
FIG. 2 is a block diagram illustrating a configuration of a circuit design system related to the first embodiment of the present invention.

FIG. 2 is a block diagram illustrating a configuration of a circuit design system related to a first embodiment of the present invention. That circuit design system comprises a storage 1, a layout unit 2 and a test point process unit 3. The netlist NET indicating connection information on the circuit as a design object and layout data LAY indicating the layout thereof are stored in the storage 1. The layout unit 2 carries out the layout process and prepares the layout data LAY from the netlist NET.

The test point insertion unit 3 carries out a process of test point insertion. The test point insertion is carried out prior to the layout process. Otherwise, the test point insertion can be carried out after the layout data LAY is temporarily prepared. In that case, the layout unit 2 prepares the layout data LAY again after the test point insertion process. That test point processing unit 3 includes a stuck-at fault extraction unit 10, an equivalent fault extraction unit 20, an insertion position searching unit 30, an independent fault extraction unit 40, a fault probability calculation unit 50, a determination unit 90 and a test point insertion unit 80. The determination unit 90 includes an improvement effect calculation unit 60 and an insertion positioning unit 70.

Figure 3:
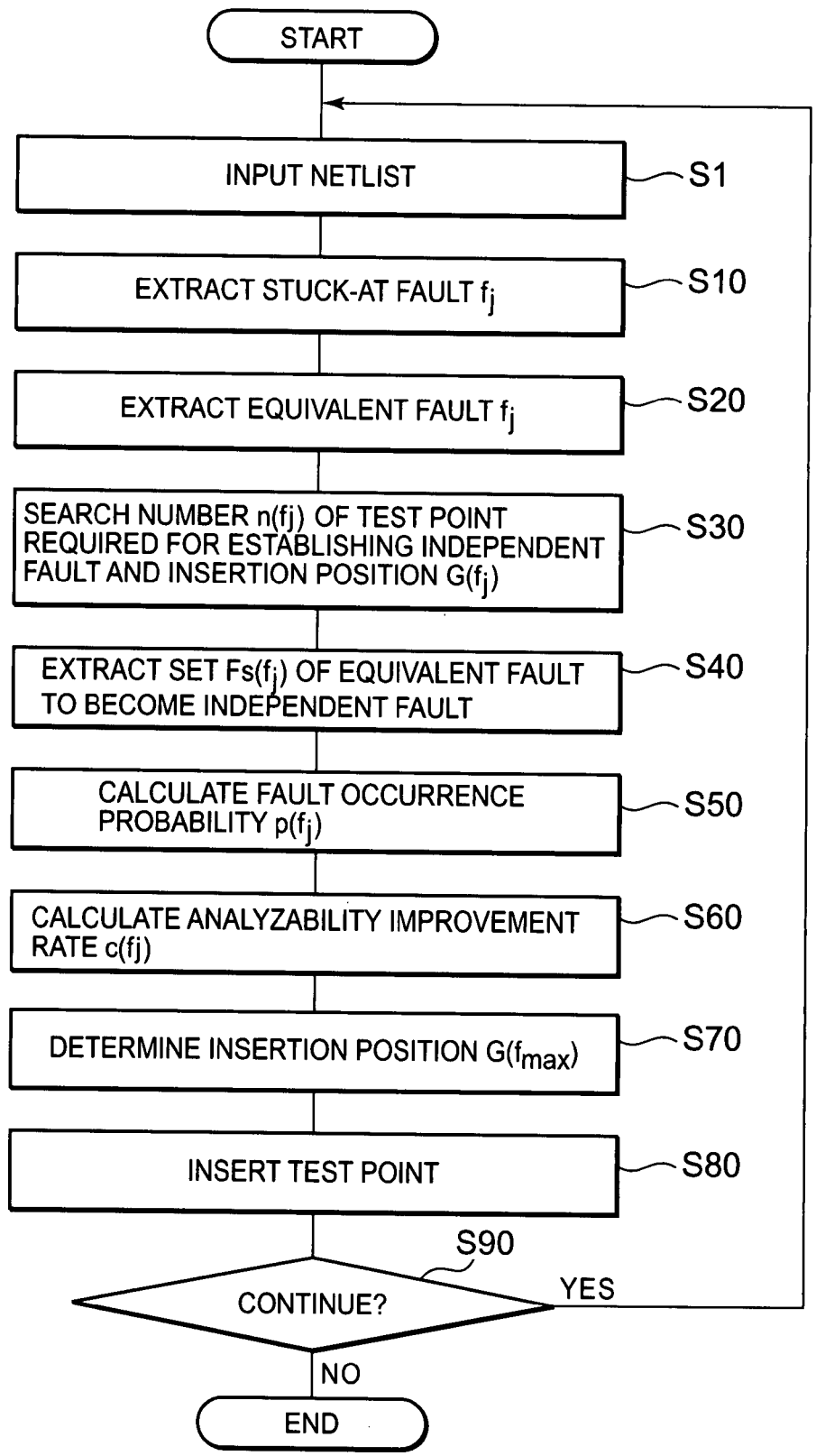
FIG. 3 is a flow chart illustrating a circuit design method related to the first embodiment.

FIG. 3 is a flow chart illustrating the summary of the test point insertion process related to the present embodiment. With reference to FIG. 2 and FIG. 3, the test point insertion process related to the present invention embodiment will be described schematically.

At first, the test point processing unit 3 reads the netlist NET from the storage 1 (Step S1). Next, the stuck-at fault extraction unit 10 makes reference to the netlist NET to extract all the stuck-at faults fi possibly taking place in a circuit for design (Step S1). Next, the equivalent fault extraction unit 20 extracts a plurality of equivalent faults f$_j$ keeping mutually equivalent relation from all the stuck-at faults fi (Step S20). A set of the equivalent faults f$_j$ is a unit of a set of the stuck-at faults fi.

Next, the insertion position searching unit 30 carries out the following process on the respective equivalent faults f$_j$ (hereinafter to be referred to as search object equivalent fault f$_j$). That is, the insertion position searching unit 30 searches a number n(f$_j$) of test points required for the search object equivalent fault f$_j$ to become an "independent fault" and the insertion position G(f$_j$). The independent fault refers to a fault in presence of an equivalent fault keeping equivalent relation only with itself and is a fault subjected to elimination of equivalent relation with the other faults. That is, the insertion position searching unit 30 searches a number n(f$_j$) of test points required for keeping equivalent relation with the search object equivalent fault f$_j$ to become "1" and the insertion position G(f$_j$).

In the case where a test point is inserted to the above described insertion position G(f$_j$), not only the search object equivalent fault f$_j$ but also another equivalent fault f$_j$ possibly become an independent fault. According to the present embodiment, such another equivalent faults f$_j$ is also taken into consideration. Therefore, the independent fault extraction unit 40 extracts a set Fs(f$_j$) of an equivalent fault f$_j$ to become an independent fault concurrently at an occasion when a test point is inserted into a insertion position G(f$_j$) (Step S40).

At an occurrence when a single stuck-at fault takes place, if the relevant single stuck-at fault is included in a set of independent faults Fs(f$_j$), the fault sites (fault candidates) can be narrowed down to one node by fault diagnosis. Accordingly, the fault probability calculation unit 50 calculates probability p(f$_j$) of the relevant single stuck-at fault being included in the above described set Fs(f$_j$) (Step S50). In the circuit region with large cell-to-cell distance, wiring bringing the cells into connection will get long. Therefore probability of fault occurrence will become large. Accordingly, the probability p(f$_j$) of the single stuck-at fault being included in the set Fs(f$_j$) is given by the following equation (3), for example.

[Formula 3]

$$p(f_j) = \frac{1_s(f_j)}{2 \cdot 1_{ALL}} \quad (3)$$

In the above described equation (3), the length $1_{all}$ is a total length of the entire wiring included in the entire design object circuit. The length ls(f$_j$) is a total of wiring length of nodes of the equivalent faults f$_j$ included in the set Fs(f$_j$) and given by the following equation (4).

[Formula 4]

$$1_s(f_j) = \sum\nolimits^{F_s(f_j)} 1(j) \quad (4)$$

In the above described equation (4), the length l(j) is a wiring length of the nodes of the respective equivalent faults $f_j$. The wiring length l(j) can be approximately obtained from the cell-to-cell distance (Euclidean distance and Manhattan distance), for example. Acquisition of information on cell-to-cell distance is provided as a function of the layout unit 2, for example. Specifically, as illustrated in FIG. 2, the layout unit 2 includes a wiring length acquisition unit 5. That wiring length acquisition unit 5 can approximately calculate the wiring length l(j) based on the result of the cell arrangement process. Otherwise, the wiring length acquisition unit 5 can correctly calculate the wiring length l(j) based on the result of the layout process. Wiring length data LEN indicating the calculated wiring length l(j) is supplied to the test point processing unit 3. The fault probability calculation unit 50 makes reference to the wiring length data LEN thereof and, thereby, can calculate the above described probability $p(f_j)$.

Next, the determination unit 90 determines to which insertion position $G(f_j)$ the test points are inserted. In the case where the test points are inserted into the insertion position $G(f_j)$, even if stuck-at fault has taken place in the set $Fs(f_j)$ at the probability $p(f_j)$, the fault sites can be specified. In other words, by inserting the test points into the insertion position $G(f_j)$, fault analyzability is improved only for a portion corresponding with the probability $p(f_j)$. In that means, the probability $p(f_j)$ can be referred to also as "analyzability improvement level". In order to enhance the effects by test point insertion, it is preferable to insert a test point into an insertion position $G(f_j)$ giving a high analyzability improvement level $p(f_j)$. However, since various numbers $n(f_j)$ of required test point are present, it is convenient to standardize the fault analyzability improvement level $p(f_j)$ with the number $n(f_j)$ of test point. Therefore, the improvement effect calculation unit 60 of in the determination unit 90 calculates the parameter $e(f_j)$ derived by the following equation (5).

[Formula 5]

$$e(f_j)=p(f_j)/n(f_j) \quad (5)$$

The parameter $e(f_j)$ thereof is a standardized analyzability improvement level and can be called "analyzability improvement rate" for one test point. The improvement effect calculation unit 60 calculates the analyzability improvement rate $e(f_j)$ on respective patterns of the insertion position $G(f_j)$(Step S60). And, the insertion position searching unit 70 determines the insertion position $G(f_{max})$ giving the maximum analyzability improvement rate e(fmax) among the calculated $e(f_j)$ as final test point insertion position. Thus, the determination unit 90 determines the position G(fmax) where the test points should be inserted.

The test point insertion unit 80 respectively inserts $n(f_{max})$ units of test points into the determined insertion position $G(f_{max})$(Step S80). Consequently, the netlist NET is updated. The netlist NET where the test points are inserted is stored in the storage 1.

Moreover, in the case where insertion of test points is required (Step S90; Yes), the above described processes S1 to S80 are repeated. When insertion of the required test points ends (Step S90; No), the process by the test point processing unit 3 ends. Thereafter, the layout unit 2 reads the netlist NET from the storage 1 to carry out the layout process. The prepared layout data LAY are stored in the storage 1. And based on the layout data LAY thereof, the designed semiconductor integrated circuit with fault analyzability is manufactured. Consequently, semiconductor integrated circuit with fault analyzability is obtained.

1-2. Details of Test Point Insertion Process

Next, presenting examples, the test point insertion process related to the present embodiment will be described in detail.

Step S1: Input of Netlist

Figure 4:
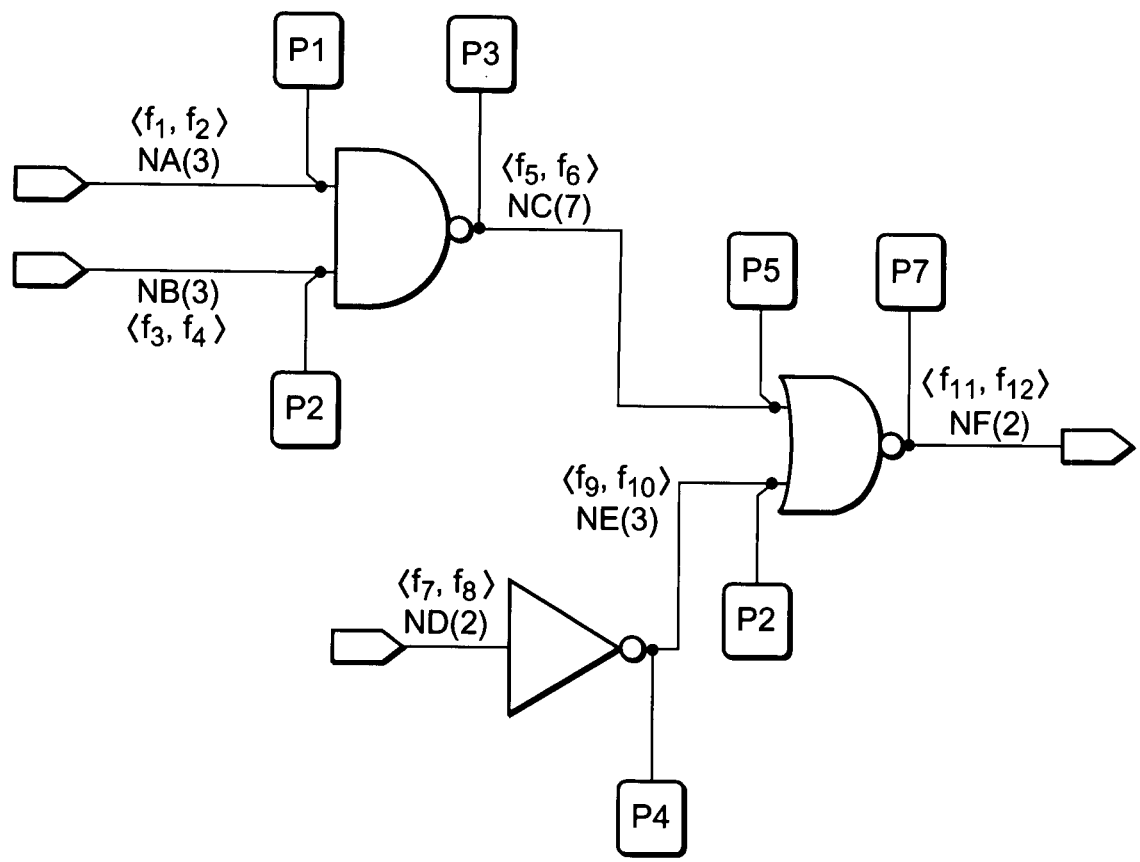
FIG. 4 is a circuit diagram illustrating a circuit example used in the description of the circuit design process related to the present invention.

The test point processing unit 3 reads the netlist NET from the storage 1. FIG. 4 schematically illustrates an example of a logic circuit presented by the netlist NET on a gate level. The logic circuit illustrate in FIG. 4 includes a NAND element, a NOR element, an inverter element and six nodes NA to NF. An input of the NAND element is connected to the nodes NA and NB and an output thereof is connected to the node NC. The input of the inverter element is connected to the node ND and the output thereof is connected to the node NE. An input of the NOR element is connected to the nodes NC and NE and an output thereof is connected to the node NF. Numeric values inside the bracket ( ) adjacent to each node represent the wiring length of each node. The process for the logic circuit illustrated in FIG. 4 will be exemplified below.

Step S10: Extraction of Stuck-At Fault

The stuck-at fault extraction unit 10 extracts all stuck-at faults fi possibly taking place in the design object circuit from the netlist NET. FIG. 5 presents a list of the extracted stuck-at faults f1 to f12. As presented in FIG. 5, both of a "stuck-at-0 fault" and a "stuck-at-1 fault" possibly take place at each node.

Step S20: Extraction of Equivalent Fault

The "equivalent fault" is a fault that fault diagnosis cannot specify the whereabouts. For example, in the case where a stuck-at-1 fault takes place at the node NC, the logic of the node NF is always stacked to "0". Accordingly, a fault f6 (stuck-at-1 fault at the node NC) and a fault f11 (stuck-at-0 fault at the node NF) are mutually equivalent and, therefore, it is impossible to discriminate by fault diagnosis which is the true fault. That is, the fault f6 and the fault f11 are both equivalent faults.

On the other hand, the fault including no equivalent fault except itself is referred to as "independent fault". That is, the independent fault is a fault including only itself as an equivalent fault to keep equivalent relation and is a fault subjected to elimination of equivalent relation with the other faults. The position of the independent fault can be specified by fault diagnosis.

The equivalent fault extraction unit 20 extracts equivalent faults $f_j$ from all the stuck-at fault fi. FIG. 6 presents extracted equivalent faults $f_j$. Here, a series of fault classes keeping mutually equivalent relation is referred to as "equivalent fault class". The first equivalent fault class is configured by mutually equivalent fault $f_j=\{f_1, f_3, f_6, f_7, f_{10}, f_{11}\}$. The second equivalent fault class is configured by mutually equivalent fault $f_j=\{f_8, f_9\}$. The fault other than the first and the second equivalent faults is an independent fault.

In the case of occurrence of any of the equivalent faults presented in FIG. 6, it is not possible to specify the true faulty sites only by fault diagnosis. In order to improve accuracy on fault diagnosis, it is necessary to insert test points into a circuit. The symbols P1 to P7 in FIG. 4 represent test point insertion positions. Here, in order to simplify the description, inter-cell faults do not take place. In addition, the insertion positions P1 to P7 are positioned in the immediate vicinity of the input and output terminals of the elements. In addition, as for the inverter element, insertion of test point into either the input or the output will be sufficient. In the present example, the test point will not be inserted into the node ND.

Subsequently, a process of determining to which of the insertion position P1 to P7 the test point should be inserted is carried out.

Step S30: Number of Test Point Required for Attaining Independent Faults and Search for Insertion Position The insertion position searching unit 30 carries out the following process on each of the equivalent faults $f_j$ (herein after to be referred to as search object equivalent fault $f_j$). That is, the insertion position searching unit 30 checks equivalent relation between the search object equivalent fault $f_j$ and the other equivalent faults $f_j$ and searches insertion position $G(f_j)$ of test points required for eliminating the equivalent relation. That is, the insertion position searching unit 30 searches the insertion position $G(f_j)$ of test points required for the search object equivalent fault $f_j$ to become an independent fault. If the required insertion position $G(f_j)$ is determined, the number $n(f_j)$ of the required test points is automatically determined.

FIG. 7 presents the insertion position $G(f_j)$ and the number $n(f_j)$ on each the equivalent faults $f_j$. For example, in order to make the fault f1 (stuck-at-0 fault at the node NA) into an independent fault, it is necessary to insert a test point into the position P1 in FIG. 4. In order to make the fault f6 (stuck-at-1 fault at the node NC) into an independent fault, it is necessary to insert test points into the two positions P3 and P5 in FIG. 4. In addition, in the case where one test point is inserted into the position P4, it is apparent that each of the equivalent faults f7, f8 and f9 will make an independent fault. That is, relation $G(f7)=G(f8)=G(f9)=P4$ is kept.

Step S40: Extraction of Set of Equivalent Faults to Become Independent Faults

Next, at an occasion when a test point is inserted into the insertion position $G(f_j)$, the independent fault extraction unit 40 extracts the set $Fs(f_j)$ of search object equivalent fault $f_j$ concurrently together with the equivalent fault becoming an independent fault. For example, as presented in FIG. 7, in order to make the fault $f_7$ an independent fault, it is necessary to insert a test point to the position P4. At that occasion, not only the fault f7 but also the faults f8 and f9 become independent faults. Accordingly, the set $Fs(f7)=\{f_7, f_8, f_9\}$ corresponds to the insertion position $G(f_7)$. In addition, since the insertion positions are the same, the same set $Fs=\{f_7, f_8, f_9\}$ is obtained on the faults f8 and f9 as well.

Thus, the set $Fs(f_j)$ is determined uniquely for a certain insertion position $G(f_j)$. Since the pattern of the insertion position $G(f_j)$ possibly overlaps, it is convenient to obtain the set Fs ($f_j$) not on the equivalent fault $f_j$ basis but on the basis of the pattern of the insertion position $G(f_j)$. It is apparent from FIG. 7 that the insertion positions $G(f_j)$ are consolidated into six types of the patterns with (1) only P1, (2) only P2, (3) only P3 and P5, (4) only P4, (5) P4 and P6 and (6) P7 only. Those patterns are expressed as insertion position $G(k)(k=1$ to 6).

FIG. 8 represents the set $Fs(k)$ obtained for each of the pattern of the insertion position $G(k)$. As presented in FIG. 8, the element of the set $Fs(1)$ corresponding to the insertion position $G(1)$ is only the fault f1. The elements of the set $Fs(4)$ corresponding to the insertion position $G(4)$ are the fault $f_7$, the fault $f_8$ and the fault $f_9$.

Step S50: Calculation of Fault Occurrence Probability

Next, the fault probability calculation unit 50 calculates the probability $p(f_j)$ of a single stuck-at fault being included in the above described set $Fs(f_j)$ at an occasion when the relevant stuck-at fault takes place. The probability $p(f_j)$ is calculated based on the already introduced equation (3) and equation (4). At that occasion, due to the same reason as the above described reason, it is convenient to calculate the probability $p(k)$ not on the equivalent fault $f_j$ basis but on the basis of the pattern of the insertion position $G(k)$. In that case, replacement of "$f_j$" with "k" will be sufficient. The probability $p(k)$ is given by the following equation (6) and equation (7).

[Formula 6]
$$p(k) = \frac{1_s(k)}{2 \cdot 1_{ALL}} \quad (6)$$

[Formula 7]
$$1_s(k) = \sum_{j}^{E_s(k)} 1(j) \quad (7)$$

The equation (6) and the equation (7) are respectively equivalent to the already described equation (3) and equation (4). The probability $p(k)$ is occurrence probability of a fault included in the set $Fs(k)$ and "analyzability improvement level" obtained by the insertion position $G(k)$.

FIG. 9 presents probability $p(k)$ calculated with the equation (6) and the equation (7) on each pattern (k). The total wiring length $l_{all}$ included in the entire design object circuit is 20 (see FIG. 4). For example, in the case of the "pattern 1", the wiring length ls(1) is 3. Accordingly, the probability $p(\mathbf{1})$ is 7.50%. In addition, in the case of the "pattern 4", the set $Fs(\mathbf{4})$ includes the faults f7, f8 and f9. The total wiring length ls(4) is 7(=2+2+3). Accordingly, the probability $p(\mathbf{4})$ is 17.5%.

Step S60: Calculation of Analyzability Improvement Rate

Next, the improvement effect calculation unit 60 calculates the analyzability improvement rate $e(k)$ for one test point based on the above described probability $p(k)$ and the above described number $n(k)$. The analyzability improvement rate $e(k)$ is given by the following equation (8) equivalent to the already presented equation (5).

[Formula 8]
$$e(k)=p(k)/n(k) \quad (8)$$

FIG. 10 presents the analyzability improvement rate $e(k)$ calculated with the equation (8) on each pattern (k). The analyzability improvement level $p(\mathbf{5})$ for the "pattern 5" was maximum (=25%). However, in that case, two test points are required and, therefore, the analyzability improvement rate $e(k)$ will become 12.50%.

On the other hand, the analyzability improvement level $p(\mathbf{4})$ for the "pattern 4" was 17.5% (<25%). However, one test point is required and, therefore, the analyzability improvement rate $e(k)$ remains at 17.5%. Consequently, as presented in FIG. 10, the case of the "pattern 4", that is, in the case where one test point is inserted into the position P4, the analyzability improvement rate will become maximum.

Step S70: Determination on Test Point Insertion Position

In order to enhance the effects by test point insertion, it is preferable to insert test points into insertion positions $G(k)$ giving high analyzability improvement rate $e(k)$. In the present embodiment, the insertion positioning unit 70 determines the $G(f_{max})$ giving the maximum analyzability improvement rate $e(f_{max})$ as the final test point insertion position. In the case of the present example, the insertion position $G(\mathbf{4})=P4$ is determined as the test point insertion position.

Step S80: Insertion of Test Point

The test point insertion unit 80 respectively inserts the $n(f_{max})$ test points into the determined insertion position $G(f_{max})$. In the case of the present example, one test point is inserted into the position P4 in FIG. 4.

Step S90:

In the case where the test point insertion continues, the process returns to the Step S1 so that the likewise process is repeated. For example, in the above described Step S80, when a test point is inserted into the position P4, the faults f7, f8 and f9 will become independent faults. The analyzability improvement rate e(k) of those nodes and the fault nodes adjacent thereto changes. Therefore, recalculation of the analyzability improvement rate e(k) will be required.

In the procedure described above, test point insertion will enhance the probability of enabling the fault candidate to be narrowed down to one node by fault diagnosis. In addition, since less test points realize the above process, the probability of enabling the fault candidate to be narrowed down to one node by fault diagnosis is efficiently improved.

1-3. Assessment

Figure 11:
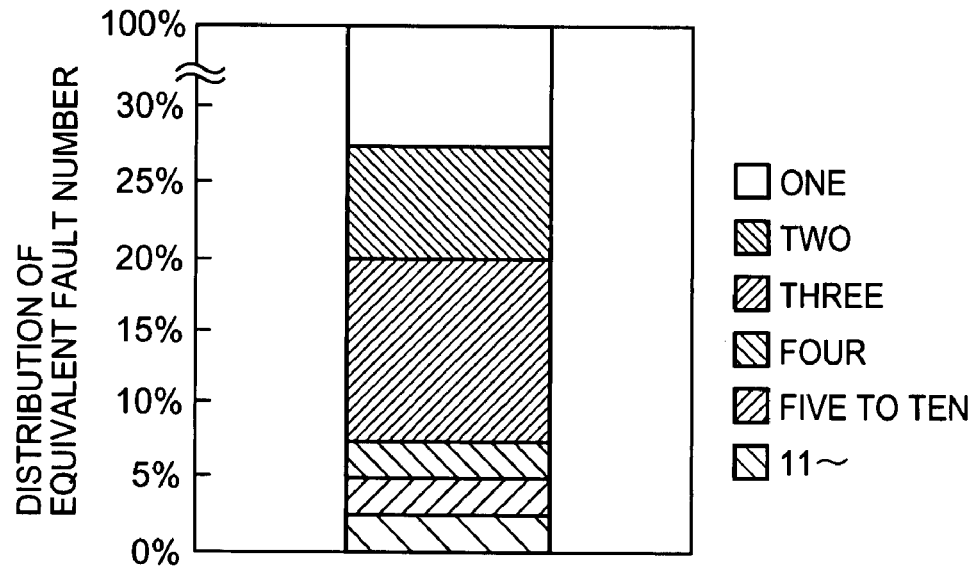
FIG. 11 is a graph illustrating distribution of the number of fault candidate (equivalent fault) at an occasion when a single stuck-at fault has taken place in a product circuit.
Figure 12:
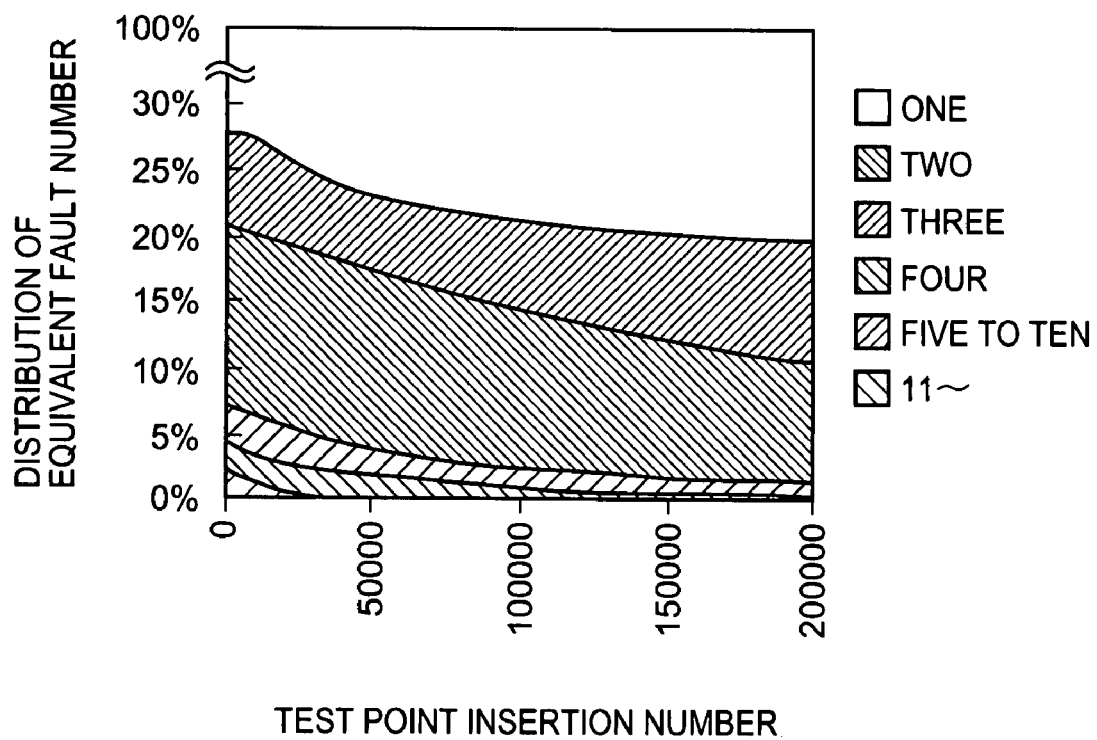
FIG. 12 is a graph illustrating the change in distribution illustrated in FIG. 11 by test point insertion based on the algorithm described in the preceding application (Japanese Patent Application Laying Open 2005-313953).
Figure 13:
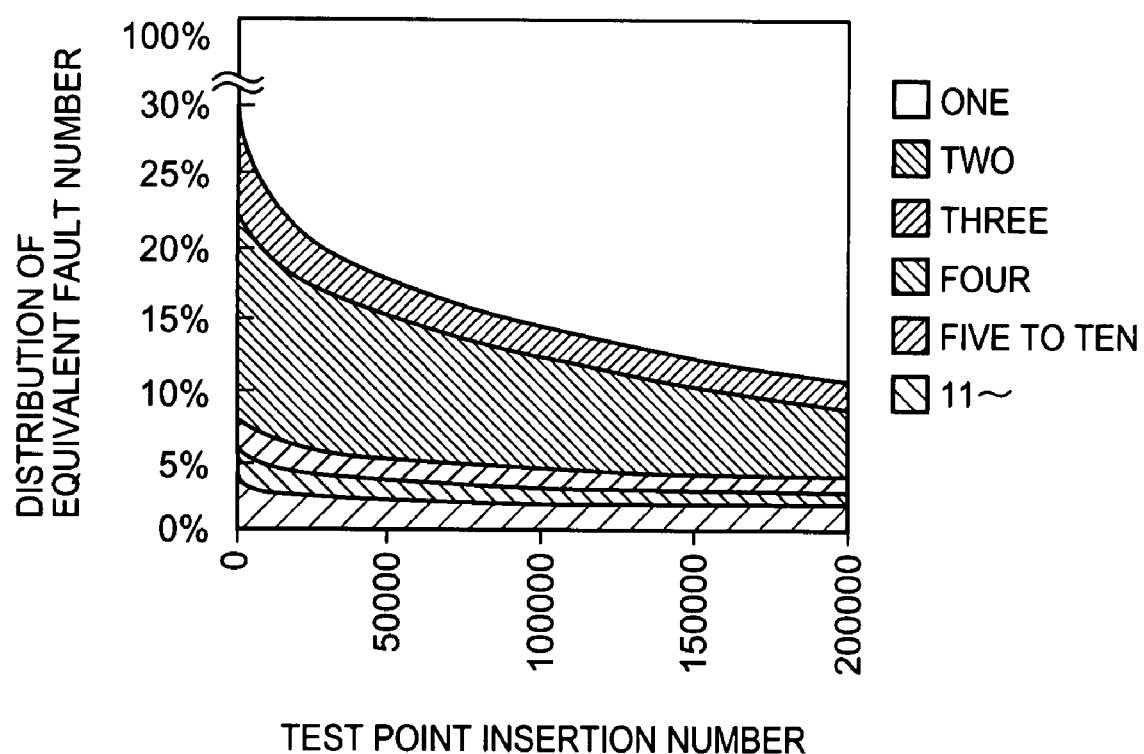
FIG. 13 is a graph illustrating the change in distribution illustrated in FIG. 11 by test point insertion based on the algorithm related to the present invention.

Next, in order to validate the effects by the present invention, design data of a product with approximately a million of gates were prepared. And, the case where the test points were inserted according to an algorithm related to the present invention, and the case where the test points were inserted according to an algorithm related to the conventional system were brought into comparison. FIG. 11 to FIG. 13 present the distribution of the number of fault candidate (equivalent fault) at an occasion when a single stuck-at fault has taken place in an arbitrary wiring of a product circuit. That distribution was calculated by accumulating the fault probability in the respective wiring (see the Equation (3)).

FIG. 11 presents distribution before a test point is inserted. For example, the white region represents independent fault with the equivalent fault number being 1 and the percentage thereof is approximately 73%. That is, in the case where a single stuck-at fault has taken place, the relevant stuck-at faults are independent faults at the probability of the percentage of approximately 73%. In addition, based on FIG. 11, the probability $p(f_j)$ with the equivalent fault number being not less than 5 will be apparently approximately 5%.

FIG. 12 presents changes in distribution of equivalent faults in the case where the test points were inserted based on the algorithm related to the conventional system. On the other hand, FIG. 13 changes in distribution of equivalent faults in the case where the test points were inserted based on the algorithm related to the present invention. In FIG. 12 and FIG. 13, the horizontal axis represents the insert in number of test points.

As presented in FIG. 12 and FIG. 13, as the insert in number of the test point increases, the equivalent fault number is decreasing. A reason thereof is that equivalent relation between faults is eliminated by the test point insertion. In addition, by brining FIG. 12 and FIG. 13 into comparison, it is apparent that the probability with the equivalent fault number to become 1 gets higher than in the case of the present invention. For example, the case where the insertion number of the test point is five thousand is taken into consideration. The conventional system, the percentage of the independent fault is around 77%. In contrast, in the present invention, the percentage of the independent fault will become around 83%. That is, in the case where the same number of test points is inserted, the present invention is larger in the probability with a stuck-at fault being an independent fault at an occurrence of the relevant stuck-at fault. That is, according to the present invention, the probability enabling the fault candidate to be narrowed down to one node by fault diagnosis will get larger than that in the case of the conventional system.

However, the probability of a lot of equivalent faults (fault candidates) being present at a stuck-at fault occurrence will get smaller in the case of the conventional system. For example, the case where the insertion number of the test point is five million is taken into consideration. In the conventional system, the probability of the equivalent fault in excess of 10 is approximately 0. In contrast, in the present invention, the probability $p(f_j)$ thereof is several percents. Thus, according to the present invention, test points are inserted mainly into the faults with fewer equivalent faults. The test points are hardly inserted into the fault with a lot of equivalent faults. Therefore, since the number equivalent fault is large, the probability $p(f_j)$ of making fault analysis difficult will get larger than that in the case of the conventional system.

1-4. Advantages

According to the present invention, at an occasion when a fault has taken place, the probability of the fault candidates allowed to be narrowed down into one node by the faulty diagnosis will be improved efficiently. In particular, in the case where defective samples to be analyzed are present in a large quantity, such an advantage is obtained that analysis efficiency is improved dramatically. A reason thereof will be described below.

In the case where a plurality of nodes are nominated as fault candidates in fault diagnosis, in order to specify the true fault sites, it is required to repeat wiring exposure process with an FIB apparatus and observation with an EB analyzer. For that purpose, an enormous number of man-hours and costs are required. On the contrary, it can be said that the fault sample enabling the fault sites to be narrowed down into one node only by the faulty diagnosis is analyzed easily.

In the case where the number of defective sample is large at an occasion when a new manufacturing line or products are introduced, fault analysis on all the defective samples is approximately impossible. Accordingly, only such samples with faults the causes of which are specifiable in short time are extracted, enhancement in fault analysis is planned. As such analyzable samples increase in amount, more fault analysis will become feasible to improve the whole analysis effects. Accordingly, by adopting the technique related to the present invention, enhancing the probability of enabling the fault sites to be narrowed down, the percentage of the analyzable samples will get larger even if the case where defective samples are present in a large quantity. Consequently, such an advantage that the whole analysis effects are improved is obtained.

However, according to the present invention, in order to enhance the probability of enabling the fault sites to be narrowed down, the test point is apt to be inserted mainly into the faults with fewer fault candidate number, and test points are hardly inserted into the fault with a lot of fault candidates. Therefore, in the case where the fault sample number turns out to be small as a result of claim analysis and in the case of a lot of fault candidates, the fault analysis can become impossible. For a product requiring high reliability for automobile and aerospace fields, it is required to carry out fault analysis for one good with complaints from the market in a certain manner. The technique hereof with the case of fault analysis occasionally becoming impossible is not suitable for simplifying market complaint analysis of such a highly reliable product. For simplifying market complaint analysis of such a highly reliable product, the conventional system is more appropriate. Corresponding with the circumstances, it is preferable to use the present invention and the conventional system as the situation demands.

Second Embodiment 2-1. Configuration

In the first embodiment, the test points are inserted so that the equivalent faults $f_j$ become independent faults. On the other hand, in a second embodiment, the test point is inserted so that the equivalent fault $f_j$ becomes an element of the "independent fault pair". Here, the independent fault pair means a set of equivalent faults being positioned at mutually adjacent nodes and being deprived of the equivalent relation with the other faults. That is, a certain independent fault pair is configured by mutually equivalent two equivalent faults. Those two equivalent faults are positioned at the adjacent node. Accordingly, in the first embodiment, the fault sites are narrowed down to one node. In contrast, in the second embodiment, the fault sites are narrowed down up to two nodes.

Figure 14:
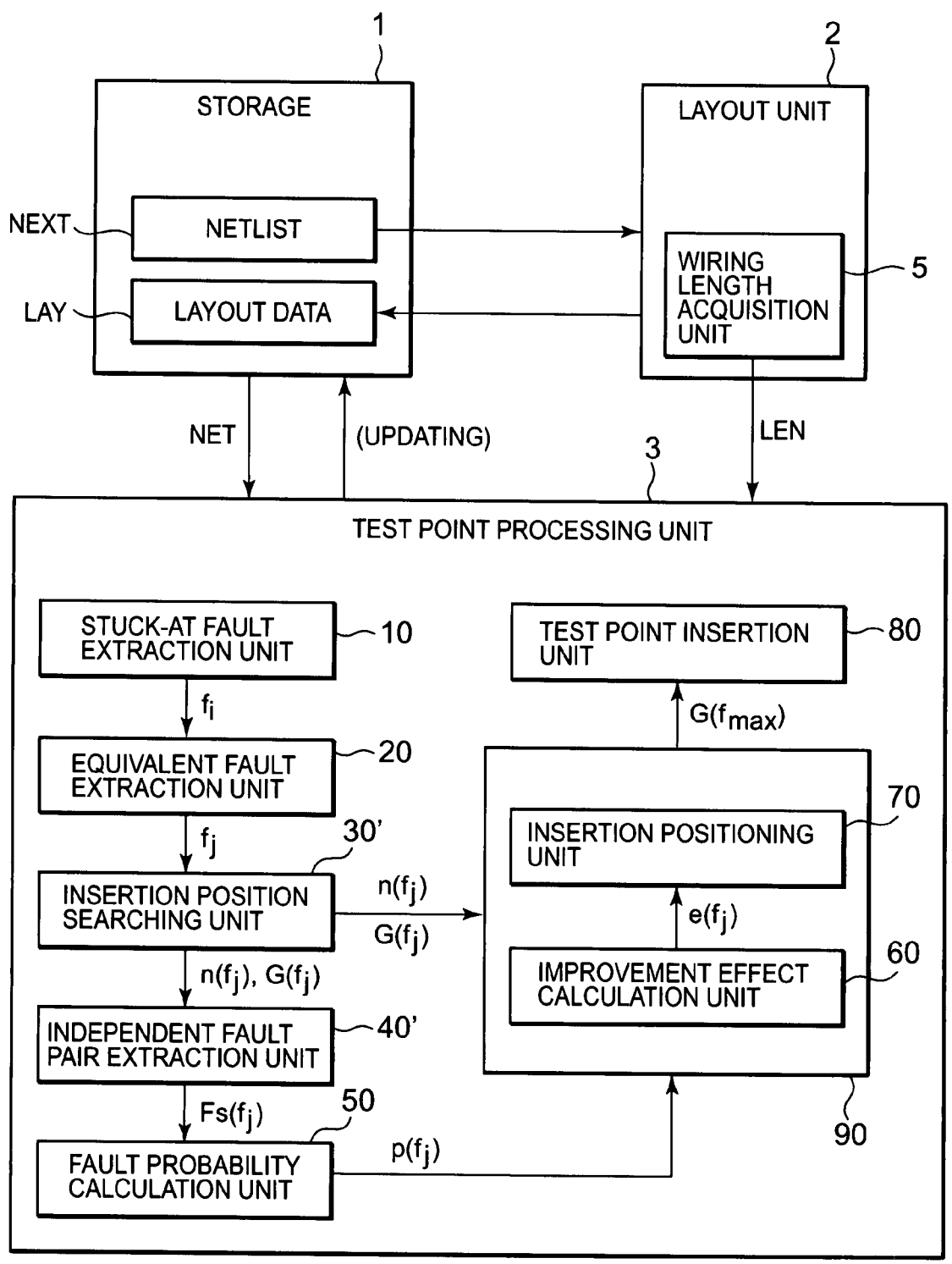
FIG. 14 is a block diagram illustrating a configuration of a circuit design system related to the second embodiment of the present invention.

FIG. 14 is a block diagram illustrating a configuration of a circuit design system related to a second embodiment of the present invention. In the present embodiment, like reference characters designate the same or similar parts for likewise configurations throughout the figures thereof so that repetitious description will be omitted appropriately.

According to the present embodiment, compared with the first embodiment, an insertion position searching unit 30' is provided instead of the insertion position searching unit 30. In addition, instead the independent fault extraction unit 40, an independent fault pair extraction unit 40' is provided. The insertion position searching unit 30' searches a number $n(f_j)$ of test points required for the search object equivalent fault $f_j$ to become an element of an independent fault pair and the insertion position $G(f_j)$. Therefore, the independent fault extraction unit 40' extracts a set $Fs(f_j)$ of an equivalent fault $f_j$ to become an element of an independent fault pair concurrently at an occasion when a test point is inserted into a insertion position $G(f_j)$.

2-2. Process

Figure 15:
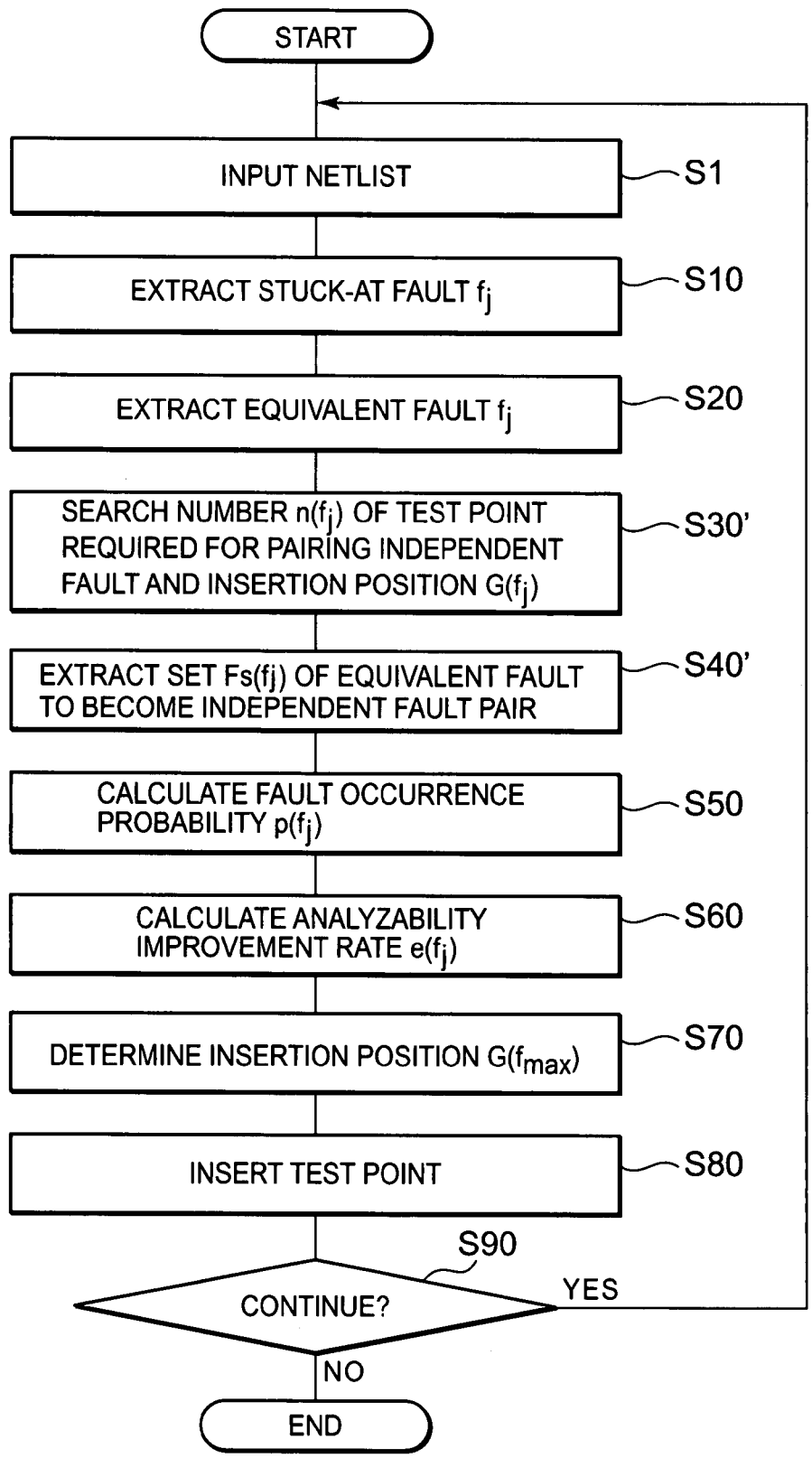
FIG. 15 is a flow chart illustrating a circuit design method related to the first embodiment.

FIG. 15 is a flow chart illustrating the summary of the test point insertion process related to the present embodiment. Description on the process likewise the process in the first embodiment will be omitted appropriately. Steps S1 to S20 are likewise those in the first embodiment.

Step S30': Search for Test Point Required for Establishing Independent Fault Pair and Insertion Position The insertion position searching unit 30' carries out the process as follows on the respective equivalent faults $f_j$ (hereinafter to be referred to as search object equivalent fault $f_j$ already presented in FIG. 6). That is, the insertion position searching unit 30' searches the insertion position $G(f_j)$ of test points required for the search object equivalent fault $f_j$ to become an element of an independent fault. If the required insertion position $G(f_j)$ is determined, the number $n(f_j)$ of the required test points is automatically determined.

FIG. 16 presents the determined insertion position $G(f_j)$ and number $n(f_j)$. For example, a fault f1 at the node NA is considered. At that occasion, the adjacent nodes sandwiching a logic gate are the nodes NB and NC (see FIG. 4). The equivalent faults $f_j$ positioned at those nodes NB and NC and keeping equivalent relation with the fault $f_j$ are faults $f_3$ and $f_6$. Accordingly, the insertion position $G(f_1)$ of the test point giving an independent fault pair $\{f_1, f_3\}$ or an independent fault pair $\{f_1, f_6\}$ are searched. As presented in FIG. 16, by inserting a test point into a position P3, for example, the faults $f_1$ and $f_3$ will make an independent pair.

In addition, a fault $f_7$ at the node ND is considered. At that occasion, the node NE is the adjacent node being present mediated by the logic gate. The equivalent fault $f_j$ located at that node NE and keeping equivalent relation with the fault $f_7$ is a failure $f_{10}$. Accordingly, the insertion position $G(f_7)$ of the test point giving an independent fault pair $\{f_7, f_{10}\}$ are searched. As presented in FIG. 16, by inserting test points into a position P6 or positions P5 and P7, the faults $f_7$ and $f_{10}$ will make an independent pair.

Moreover, a fault $f_{11}$ at the node NF is considered. As presented in FIG. 16, by inserting test points into positions P3 and P6, for example, the faults $f_{11}$ and $f_6$ will make an independent pair. In that case, test points are inserted into the position P3, the above described independent fault pair $\{f_1, f_3\}$ can be obtained concurrently.

Figure 17:
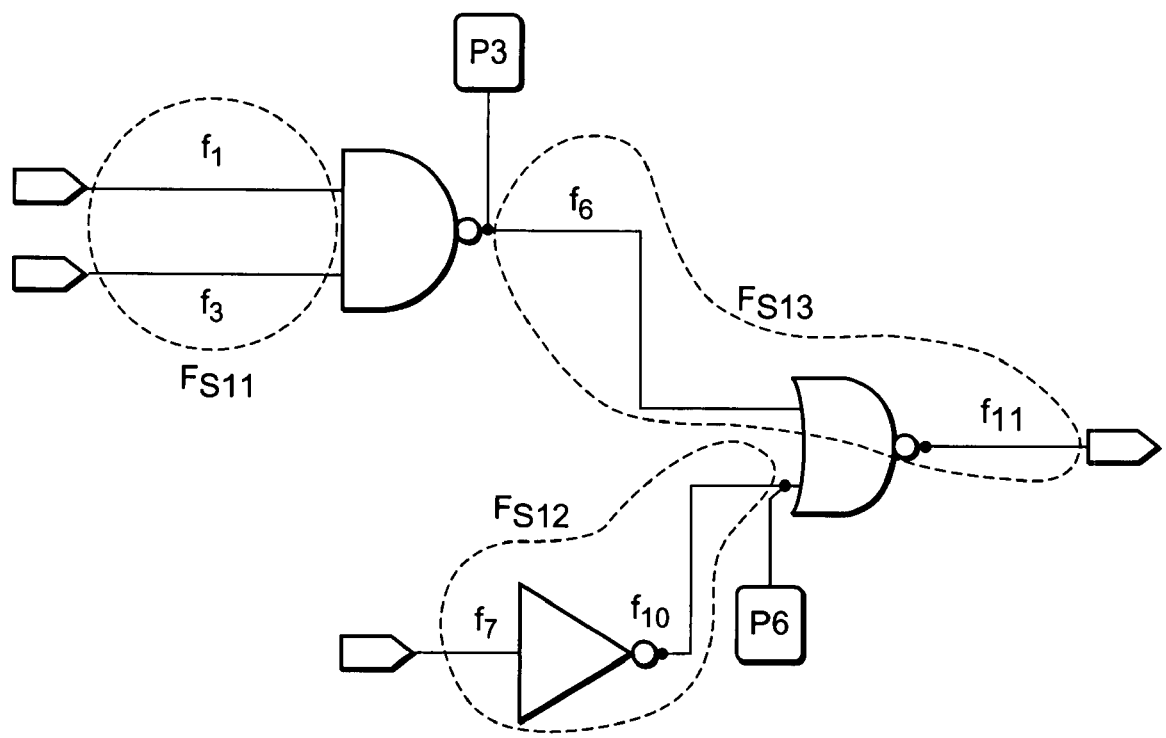
FIG. 17 is a circuit diagram exemplifying a plurality of independent fault pairs.

In addition, test points are inserted into the position P6, the above described independent fault pair $\{f_7, f_{10}\}$ can be obtained as well. FIG. 17 illustrates those circumstances conceptually. In the case where the test points are inserted into the positions P3 and P6, as illustrated in FIG. 17, three independent fault pairs $Fs_{11}=\{f_1, f_3\}$, $Fs_{12}=\{f_7, f_{10}\}$, $Fs_{13}=\{f_6, f_{11}\}$ are obtained. In each independent fault, the respective faults are adjacently present to sandwich the logic gate and are deprived of equivalent relation with the other equivalent faults $f_j$.

Step S40': Extraction of Set of Equivalent Fault Making Independent Fault Pair

Next, the independent fault extraction unit 40' extracts a set $Fs(f_j)$ of equivalent fault $f_j$ to become an element of the equivalent fault pair concurrently at an occasion when test points are inserted into the insertion position $G(f_j)$. FIG. 18 presents a set $Fs(k)$ obtained for the patterns of the insertion positions $G(k)$ respectively. For example, in the case of the pattern $G(1)$ with the test points being inserted into the positions P3 and P6, three independent fault pairs $Fs_1=\{f_1, f_3\}$, $Fs_{12}=\{f_7, f_{10}\}$ and $Fs_{13}=\{f_6, f_{11}\}$ are obtained (see FIG. 17). That is, the set $Fs(1)=\{f_1, f_3, f_6, f_7, f_{10}, f_{11}\}$ is obtained.

Thereafter, the process (Steps S50 to S80) is likewise the process in the first embodiment. That is, the fault probability calculation unit 50 calculates the probability $p(k)$ with the relevant single stuck-at fault included in a set $Fs(k)$ in the case where the relevant single stuck-at fault has taken place (see equations (3) and (4) or the equations (6) and (7)). The improvement effect calculation unit 60 calculates an analyzability improvement rate $e(k)$ for one test point based on the probability $p(k)$ and the above described number $n(k)$(see the equation (5) or the equation (8)). FIG. 18 presents the total wiring length $ls(k)$, the probability $p(k)$ and the analyzability improvement rate $e(k)$ on each of the patterns of the insertion positions $G(k)$. From FIG. 18, it is apparent that the maximum the analyzability improvement rate is obtained in the case where the test points are inserted into the positions P3 and P6 ($k=1$).

2-3. Advantages

According to the second embodiment, the advantages likewise the advantages in the first embodiment are obtained. That is, at an occasion when a fault has taken place, the probability of enabling the fault candidate to be narrowed down to two nodes by fault diagnosis is efficiently improved.

Moreover, according to the second embodiment, the probability of making fault analyzable will get higher than the probability obtained in the first embodiment. In the first embodiment, the test points are inserted so that the fault sites are narrowed down on the one node basis. Therefore, particularly in the case where the test point number is small, the test points are inserted into a part of a circuit region intensively so that the test points are not inserted into the remaining majority of the region. Consequently, the probability of a fault taking place in the vicinity of the test points will decrease. Therefore, the probability of simplifying the fault analysis by test point insertion can decrease. In contrast, according to the present embodiment, the test points are inserted at least in a single node distance. Accordingly, the test points are dispersed over a wider region. Consequently, the probability of the fault analysis being simplified by test point insertion will increase. However, the present embodiment cannot narrow down the fault sites to one node only by fault diagnosis. Therefore, after that fault diagnosis, it is necessary to specify the fault sites by using a fault analysis apparatus.

Here, in the present embodiment, the fault sites can be narrowed down not to two nodes but to three or more nodes. That is, the test points can be inserted so that the equivalent fault $f_j$ becomes one element of "independent fault group". Here, the independent fault group means N units (N being an integer not less than 2) of equivalent faults being positioned at mutually adjacent nodes sandwiching a logic gate and being deprived of the equivalent relation with the other faults. In that case, tests points are inserted so that the fault sites are narrowed down to a designated number N. However, when resolution of narrowing becomes too rough, the man-hour required for specifying the fault sites increases. Therefore, attention is required.

Third Embodiment 3-1. Configuration

Figure 19:
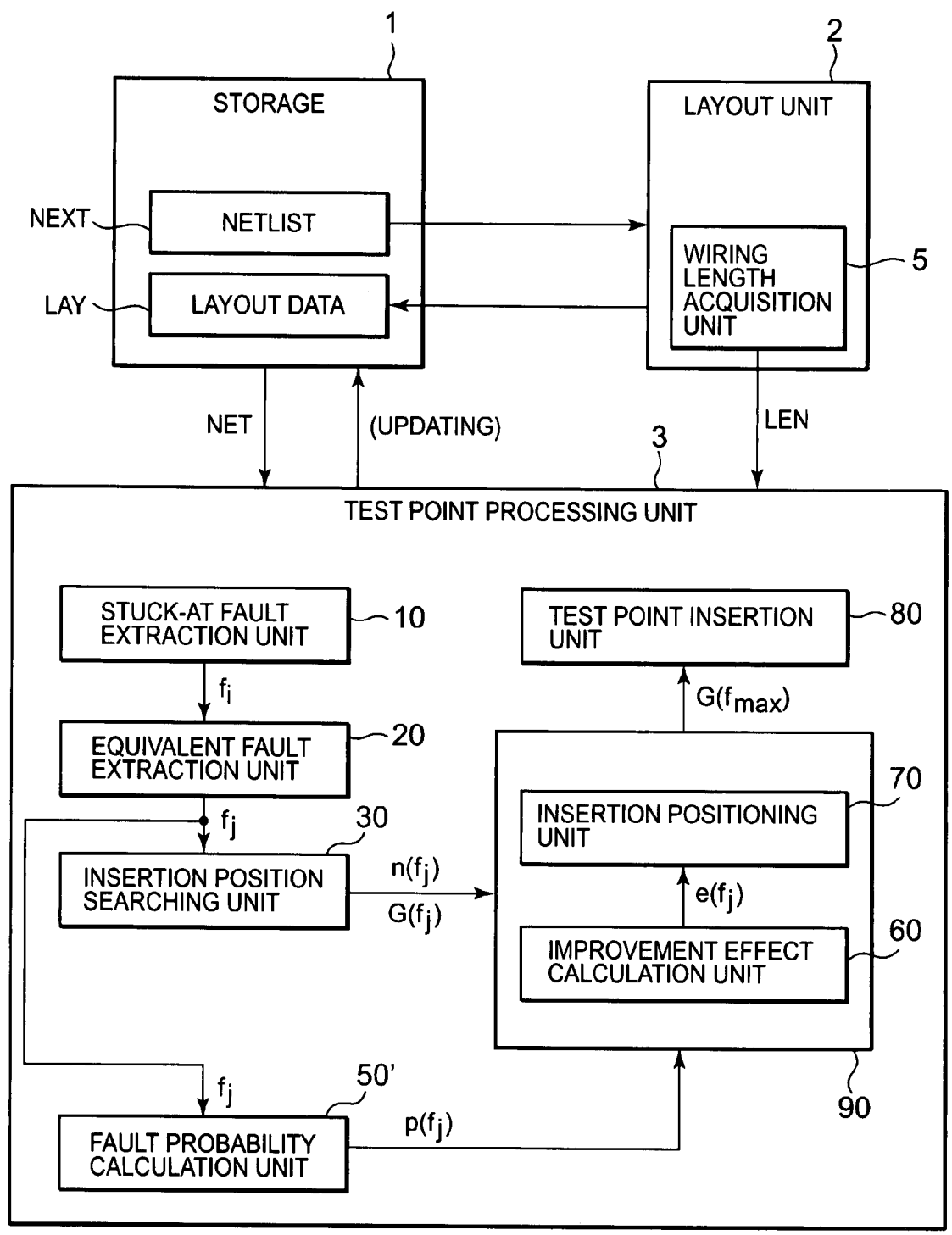
FIG. 19 is a block diagram illustrating a configuration of a circuit design system related to the third embodiment of the present invention.

FIG. 19 is a block diagram illustrating a configuration of a circuit design system related to a third embodiment of the present invention. In the present embodiment, like reference characters designate the same or similar parts for likewise configurations throughout the figures thereof so that repetitious description will be omitted appropriately.

According to the present embodiment, compared with the first embodiment, an independent fault extraction unit 40 is omitted. In addition, instead the fault probability calculation unit 50, a fault probability calculation unit 50' is provided. In the case where a single stuck-at fault has taken place, that fault probability calculation unit 50' calculates probability of the relevant single stuck-at fault corresponding with the equivalent fault $f_j$. And the calculated probability is used as the above described probability $p(f_j)$.

3-2. Process

Figure 20:
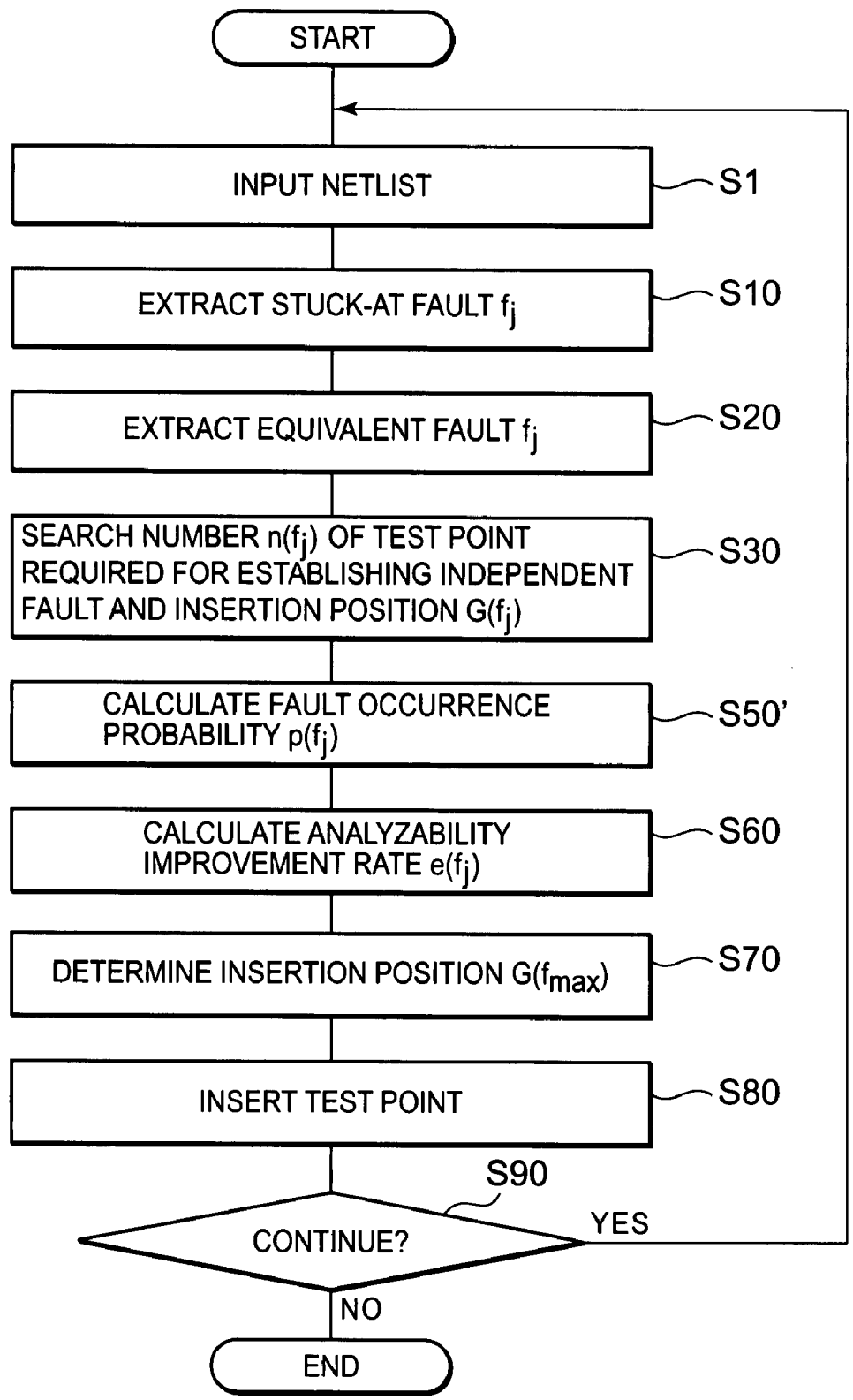
FIG. 20 is a flow chart illustrating a circuit design method related to the third embodiment.

FIG. 20 is a flow chart illustrating the summary of the test point insertion process related to the present embodiment. Description on the process likewise the process in the first embodiment will be omitted appropriately. Steps S1 to S30 are likewise those in the first embodiment. The step S40 is not carried out.

Step S50': Calculation of Fault Occurrence Probability

In the case where a single stuck-at fault has taken place, the fault probability calculation unit 50' calculates probability $p(f_j)$ of the relevant single stuck-at fault corresponding with the equivalent fault $f_j$. That is, the fault probability calculation unit 50' calculates the probability $p(f_j)$ that each of the independent faults $f_j$ occurs. In the present embodiment, the probability $p(f_j)$ is derived by the following equation (9). Compared with the equation (3) used in the first embodiment, the total wiring length $ls(f_j)$ included in the set $Fs(f_j)$ is replaced by the wiring length $l(f_j)$ of each of the fault nodes.

[Formula 9]

$$p(f_j) = \frac{l(f_j)}{2 \cdot l_{ALL}} \quad (9)$$

FIG. 21 shows a calculation result for the same circuit example (see FIG. 4) as nominated in the first embodiment. Further in detail, FIG. 21 presents, the insertion position $G(f_j)$, the number $n(f_j)$, the wiring length $l(f_j)$, the probability $p(f_j)$ and the analyzability improvement rate $e(f_j)$ on each of the equivalent faults $f_j$. The insertion position $G(f_j)$ and the number $n(f_j)$ are the same as presented in FIG. 7 already introduced. The wiring length $l(f_j)$ is the wiring length of the node of each of the equivalent faults $f_j$. The total wiring length $l_{all}$ is 20. As presented in FIG. 21, the occurrence probability $p(f_j)$ of the fault $f_6$ is 17.50% which is the largest. A reason thereof is that the wiring length of the node NC where the fault f6 occurs is the largest.

Step S60: Calculation on Analyzability Improvement Rate

Next, the improvement effect calculation unit 60 calculates the analyzability improvement rate $e(f_j)$ for one test point based on the above described probability $p(f_j)$ and the above described number $n(f_j)$ (see the equation (5)). It is apparent from FIG. 21 that the analyzability improvement rate $e(f_j)$ becomes the largest in the case of the insertion position $G(f_6)$. That is, in the case where two test points are inserted respectively to the positions P3 and P5, the analyzability improvement rate $e(f_j)$ becomes the largest. Note should be taken of the result thereof being different from the result in the first embodiment.

3-3. Advantages

According to the third embodiment, the advantages likewise the advantages in the first embodiment are obtained. That is, at an occasion when a fault has taken place, the probability of enabling the fault candidate to be narrowed down to one node by fault diagnosis is efficiently improved. Moreover, compared with the first embodiment, there is an advantage that the process is simplified. A reason thereof is that the above described Step S40 is omitted. On the other hand, the occurrence probability $p(f_j)$ only for the respective equivalent fault $f_j$ is brought into consideration. Therefore, accuracy in calculating the analyzability improvement rate $e(f_j)$ might be decreased.

Fourth Embodiment

The fourth embodiment is a combination of a system related to any of the already presented first to third embodiments and the conventional system. The system related to the present invention gives rise to advantages especially in the case of a lot of defective sample. On the other hand, the conventional system gives rise to advantages in the case where not many defective samples are present. According to the fourth embodiment, by combining the both of those systems, arrangement of the test positions is determined. Thereby, regardless of the number of the defective samples, it will become possible to simplify the fault analysis.

Figure 22:
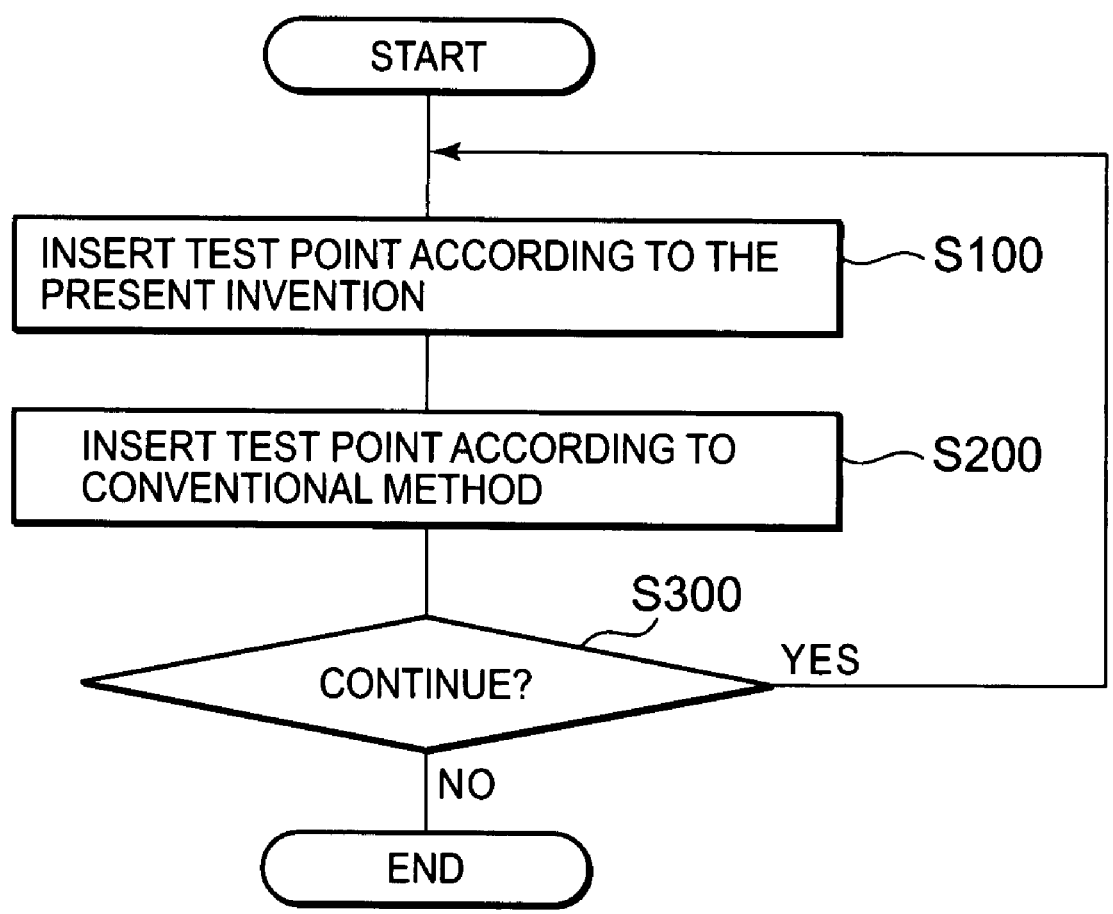
FIG. 22 is a flow chart illustrating a circuit design method related to the fourth embodiment.

FIG. 22 is a flow chart exemplifying a test point insertion process related to the present invention embodiment. At first, based on the system related to the present invention, test points are inserted (Step S100). Next, based on the conventional system, test points are inserted (Step S200). In the case where test point insertion goes on (Step S300; Yes), the process returns to the Step S100. Here, the flow presented in FIG. 22, the system related to the present invention and the conventional system are executed alternately one by one. However, the method of combination will not be limited thereto. The proportion of the execution number will not be limited to 1:1 but an arbitrary proportion can be applicable.

CAD System

Figure 23:
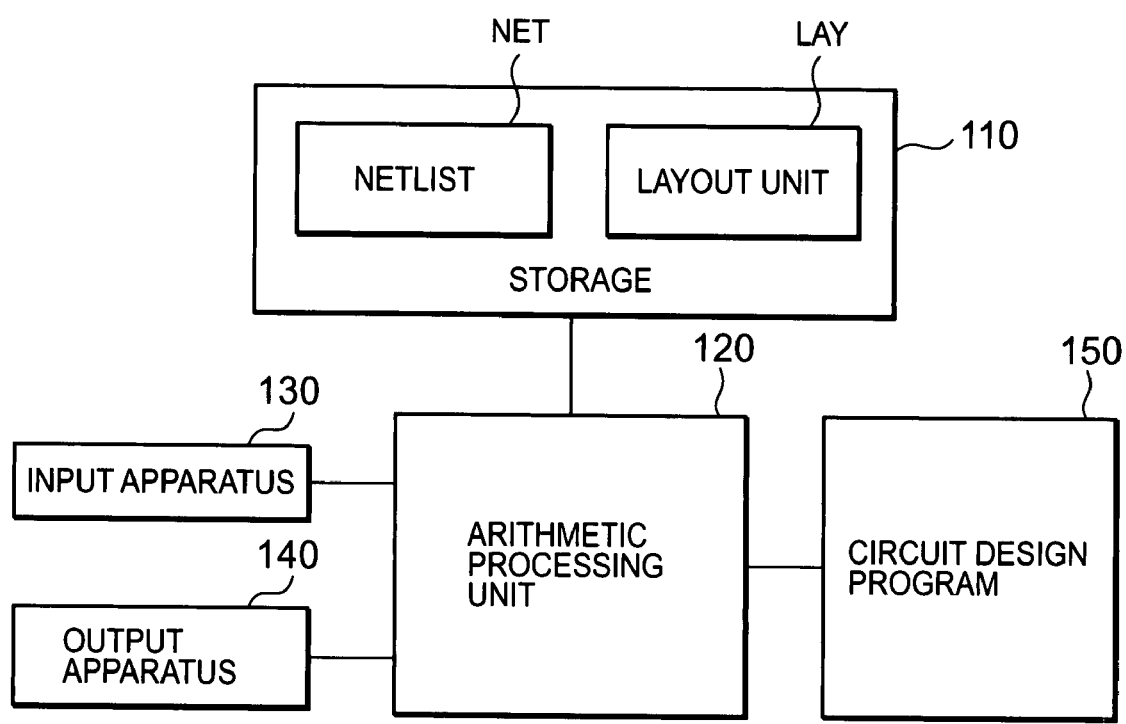
FIG. 23 is a block diagram exemplifying a configuration of a CAD system related to the present invention.

The circuit design system related to the present invention embodiment is realized on a computer. The circuit design system (CAD system) on a computer can be appropriately configured by those skilled in the art. In FIG. 23 exemplifies the system configuration thereof. A circuit design system 100 illustrated in FIG. 23 comprises a storage 10, an arithmetic processing unit 120, an input apparatus 130 and an output apparatus 140. In addition, the circuit design system 100 includes a circuit design program 150 being a computer program executed by the arithmetic processing unit 120.

As the storage 10, RAM is exemplified. The storage 10 corresponds with the above described storage 1. The netlist NET and layout data LAY are stored in that storage 110. As the input apparatus 130, a keyboard and a mouse are exemplified. As the output apparatus 140, a display is exemplified. Making reference to the information output from the output apparatus 140, the user can edit data and input commands by using the input apparatus 130.

The circuit design system 150 is stored in the storage media readable by a computer. That circuit design program 150 causes a computer to execute a circuit design process described in the already presented embodiment.

6. Summary

The present invention enhances the probability of enabling the fault candidate number to be narrowed down at least to a predetermined number. Consequently, the fault analyzability is improved. The present invention is used in order to improve fault analyzability, for example, in a CMOS logic circuit among semiconductor integrated circuits. In addition, the present invention is also applicable to the case of a logic circuit configured by bipolar, NMOS and chemical compound semiconductor elements and the like. Moreover, the present invention can be used for improving fault analyzability of printed wiring board with a wiring layer, multi-stratification of which has been remarkably progressing in the recent years, besides the semiconductor integrated circuits. Moreover, the present invention is applicable to fault analyzability of every type of logic circuit such as optical logic circuit with optical switch elements.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A computer program storage device storing a circuit design program to cause a computer to execute a circuit design process, comprising:
   (A) referring to a netlist of a circuit to extract a plurality of equivalent faults $f_j$ keeping a mutually equivalent relation from all stuck-at faults possible to occur in the circuit;
   (B) searching a number $n(f_j)$ of test points required for a number of an equivalent fault keeping an equivalent relation with a search object equivalent fault $f_j$ with each of the plurality of equivalent faults as the search object equivalent fault to become a predetermined number and an insertion position $G(f_j)$;
   (C) calculating a probability $p(f_j)$ of a single stuck-at fault being included in a set of equivalent faults including at least the search object equivalent fault $f_j$ at an occasion when the stuck-at fault takes place in the circuit;
   (D) calculating a parameter $e(f_j)$ derived by an equation: $e(f_j)=p(f_j)/n(f_j)$ on each pattern of the insertion position $G(f_j)$;
   (E) determining the insertion position $G(f_{max})$ giving a maximum value among the calculated parameters $e(f_j)$ as a position where the test point is inserted; and
   (F) respectively inserting the $n(f_{max})$ test points into the determined insertion position $G(f_{max})$.

2. The storage device according to claim 1, wherein:
the predetermined number is 1; and
in the (B) step, a number $n(f_j)$ of test points required for the search object equivalent fault $f_j$ to become an independent fault, and the insertion position $G(f_j)$, are searched.

3. The storage device according to claim 2, wherein:
the circuit design process further includes (H) extracting a set $Fs(f_j)$ of the equivalent fault $f_j$ to become an independent fault concurrently at an occasion when the test point is inserted into the insertion position $G(f_j)$ for the search object equivalent fault $f_j$; and
in the (C) step, a probability of the single stuck-at fault being included in the set $Fs(f_j)$ is calculated as the probability $p(f_j)$.

4. The storage device according to claim 1, wherein:
the predetermined number is an integer of not less than 2;
N equivalent faults are referred to as an independent fault group in the case where the N equivalent faults are positioned at mutually adjacent nodes and are devoided of the equivalent relation with other faults; and
in the (B) step, a number $n(f_j)$ of test points required for the search object equivalent fault $f_j$ to become an element of an independent fault group, and the insertion position $G(f_j)$, are searched.

5. The storaae device according to claim 4, wherein:
the circuit design process further includes (I) extracting a set $Fs(f_j)$ of the equivalent fault $f_j$ to become an element of an independent fault group concurrently at an occasion when the test point is inserted into the insertion position $G(f_j)$ for the search object equivalent fault $f_j$; and
in the (C) step, probability of the single stuck-at fault being included in the set $Fs(f_j)$ is calculated as the probability $p(f_j)$.

6. The storage device according to claim 4, wherein the integer N is 2.

7. The storage device according to claim 1, wherein
in the (C) step, a probability of the single stuck-at fault corresponding with the search object equivalent fault $f_j$ is calculated as the probability $p(f_j)$.

8. A circuit design system, comprising:
a storage that stores a netlist of a circuit;
an equivalent fault extraction unit that refers to the netlist to extract a plurality of equivalent faults $f_j$ keeping a mutually equivalent relation from all stuck-at faults possible to occur in the circuit;
an insertion position searching unit that searches a number $n(f_j)$ of test points required for a number of equivalent fault keeping an equivalent relation with a search object equivalent fault $f_j$ with each of the plurality of equivalent faults as the search object equivalent fault to become a predetermined number, and an insertion position $G(f_j)$;
a fault probability calculation unit that calculates a probability $p(f_j)$ of a single stuck-at fault being included in a set of equivalent faults including at least the search object equivalent fault $f_j$ at an occasion when the stuck-at fault takes place in the circuit;
a determination unit that calculates a parameter $e(f_j)$ derived by an equation: $e(f_j)=p(f_j)/n(f_j)$ on each pattern of the insertion position $G(f_j)$ and searching the insertion position $G(f_{max})$ giving a maximum value among the calculated parameters $e(f_j)$; and
a test point insertion unit respectively inserting the $n(f_{max})$ test points into the insertion position $G(f_{max})$.

9. The circuit design system according to claim 8, wherein:
the predetermined number is 1; and
the insertion position searching unit searches a number $n(f_j)$ of test points required for the search object equivalent fault $f_j$ to become an independent fault and the insertion position $G(f_j)$.

10. The circuit design system according to claim 9, further comprising:

an independent fault extraction unit that extracts a set $Fs(f_j)$ of the equivalent fault $f_j$ to become an independent fault concurrently at an occasion when the test point is inserted into the insertion position $G(f_j)$ for the search object equivalent fault $f_j$, wherein the fault probability calculation unit calculates a probability of the single stuck-at fault being included in the set $Fs(f_j)$ as the probability $p(f_j)$.

11. The circuit design system according to claim 8, wherein:

the predetermined number is an integer of not less than 2;

N equivalent faults are referred to as an independent fault group in the case where the N equivalent faults are positioned at mutually adjacent nodes and are devoid of the equivalent relation with other faults; and the insertion position searching unit searches a number $n(f_j)$ of test points required for the search object equivalent fault $f_j$ to become an element of the independent fault group and an insertion position $G(f_j)$.

12. The circuit design system according claim 11, further comprising:

an independent fault extraction unit that extracts a set Fs(fhd j) of the equivalent fault $f_j$ to become an element of an independent fault group concurrently at an occasion when the test point is inserted into the insertion position $G(f_j)$ for the search object equivalent fault $f_j$, wherein the fault probability calculation unit calculates a probability of the single stuck-at fault being included in the set $Fs(f_j)$ as the probability $p(f_j)$.

13. The circuit design system according to claim 11, wherein the predetermined number is 2.

14. The circuit design system according to claim 8, wherein the fault probability calculation unit calculates a probability of the single stuck-at fault corresponding with the search object equivalent fault $f_j$ as the probability $p(f_j)$.

15. A method of executing a circuit design process, comprising:

using a computer to perform:

(A) referring to a netlist of a circuit to extract a plurality of equivalent faults $f_j$ keeping a mutually equivalent relation from all stuck-at faults possible to occur in the circuit;

(B) searching a number $n(f_j)$ of test points required for a number of an equivalent fault keeping an equivalent relation with a search object equivalent fault $f_j$ with each of the plurality of equivalent faults as the search object equivalent fault to become a predetermined number and an insertion position $G(f_j)$;

(C) calculating a probability $p(f_j)$ of a sinale stuck-at fault being included in a set of equivalent faults including at least the search object equivalent fault $f_j$ at an occasion when the stuck-at fault takes place in the circuit;

(D) calculating a parameter $e(f_j)$ derived by an equation: $e(f_j)=p(f_j)/n(f_j)$ on each pattern of the insertion position $G(f_j)$;

(E) determining the insertion position $G(f_{max})$ giving a maximum value among the calculated parameters $e(f_j)$ as a position where the test point is inserted; and (F) respectively inserting the $n(f_{max})$ test points into the determined insertion position $G(f_{max})$.

* * * * *